United States Patent
Uchida

(10) Patent No.: US 12,082,418 B2
(45) Date of Patent: Sep. 3, 2024

(54) SEMICONDUCTOR MEMORY DEVICE

(71) Applicant: Kioxia Corporation, Tokyo (JP)

(72) Inventor: Keisuke Uchida, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/877,056

(22) Filed: Jul. 29, 2022

(65) Prior Publication Data

US 2022/0367507 A1 Nov. 17, 2022

Related U.S. Application Data

(63) Continuation of application No. 16/505,851, filed on Jul. 9, 2019, now Pat. No. 11,437,394.

(30) Foreign Application Priority Data

Mar. 1, 2019 (JP) .................. 2019-037445

(51) Int. Cl.
   H01L 27/11573 (2017.01)
   H01L 27/11582 (2017.01)
   H10B 43/27 (2023.01)
   H10B 43/40 (2023.01)

(52) U.S. Cl.
   CPC ............. *H10B 43/40* (2023.02); *H10B 43/27* (2023.02)

(58) Field of Classification Search
   CPC ............................................. H10B 43/00–50
   See application file for complete search history.

(56) References Cited

U.S. PATENT DOCUMENTS

| | | | |
|---|---|---|---|
| 8,946,665 B2 | 2/2015 | Shim et al. | |
| 9,165,938 B1 | 10/2015 | Kim | |
| 9,601,502 B2 | 3/2017 | Sano et al. | |
| 9,780,104 B2 | 10/2017 | Nomachi et al. | |
| 10,115,681 B1 | 10/2018 | Ariyoshi | |
| 2015/0325273 A1* | 11/2015 | Zhang ................ | G11C 5/02 365/51 |
| 2016/0071872 A1* | 3/2016 | Saito ................ | H01L 21/76224 257/314 |

(Continued)

FOREIGN PATENT DOCUMENTS

| | | |
|---|---|---|
| JP | 2014-022729 | 2/2014 |
| JP | 2018-157096 | 10/2018 |
| JP | 2018-160616 | 10/2018 |

*Primary Examiner* — John A Bodnar
(74) *Attorney, Agent, or Firm* — Oblon, McClelland, Maier & Neustadt, L.L.P.

(57) ABSTRACT

According to one embodiment, a semiconductor memory device includes: a stacked structure including a plurality of first layers stacked with a second layer therebetween above a substrate having a memory region in which a plurality of memory cells are arranged and an outer edge portion surrounding the memory region, the stacked structure having a stepped portion at which ends of the first layers form a stepped shape at an end of the stacked structure in a first direction within the memory region, wherein at least some of the first layers among the plurality of first layers extend, along a second direction perpendicular to the first direction, from above the outer edge portion at a first end side of the substrate through above the memory region over the substrate to above the outer edge portion at a second end side of the substrate.

14 Claims, 30 Drawing Sheets

(56) References Cited

U.S. PATENT DOCUMENTS

| | | | |
|---|---|---|---|
| 2016/0163732 A1* | 6/2016 | Lim | H10B 43/27 |
| | | | 257/314 |
| 2017/0358593 A1* | 12/2017 | Yu | H10B 43/27 |
| 2018/0269221 A1 | 9/2018 | Oda et al. | |
| 2018/0277564 A1 | 9/2018 | Sugiura | |
| 2019/0319038 A1* | 10/2019 | Zhang | H01L 23/535 |
| 2019/0333929 A1 | 10/2019 | Lee | |
| 2020/0168701 A1 | 5/2020 | Lin | |

* cited by examiner

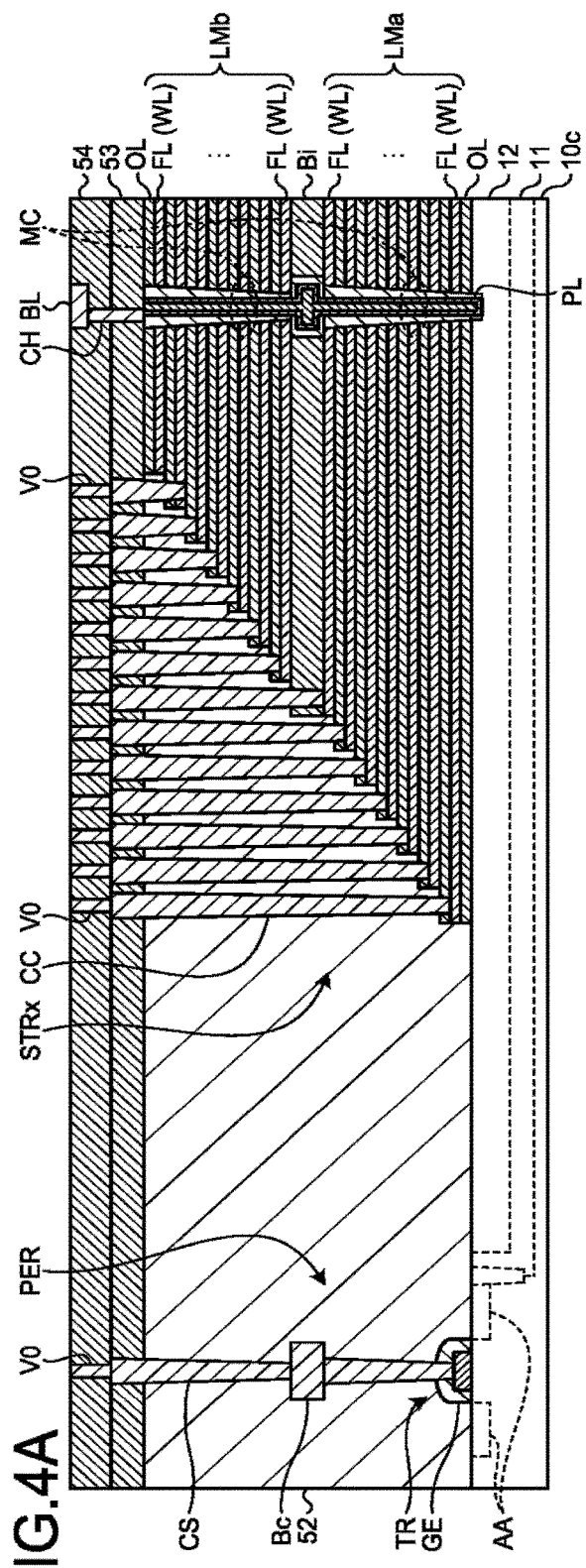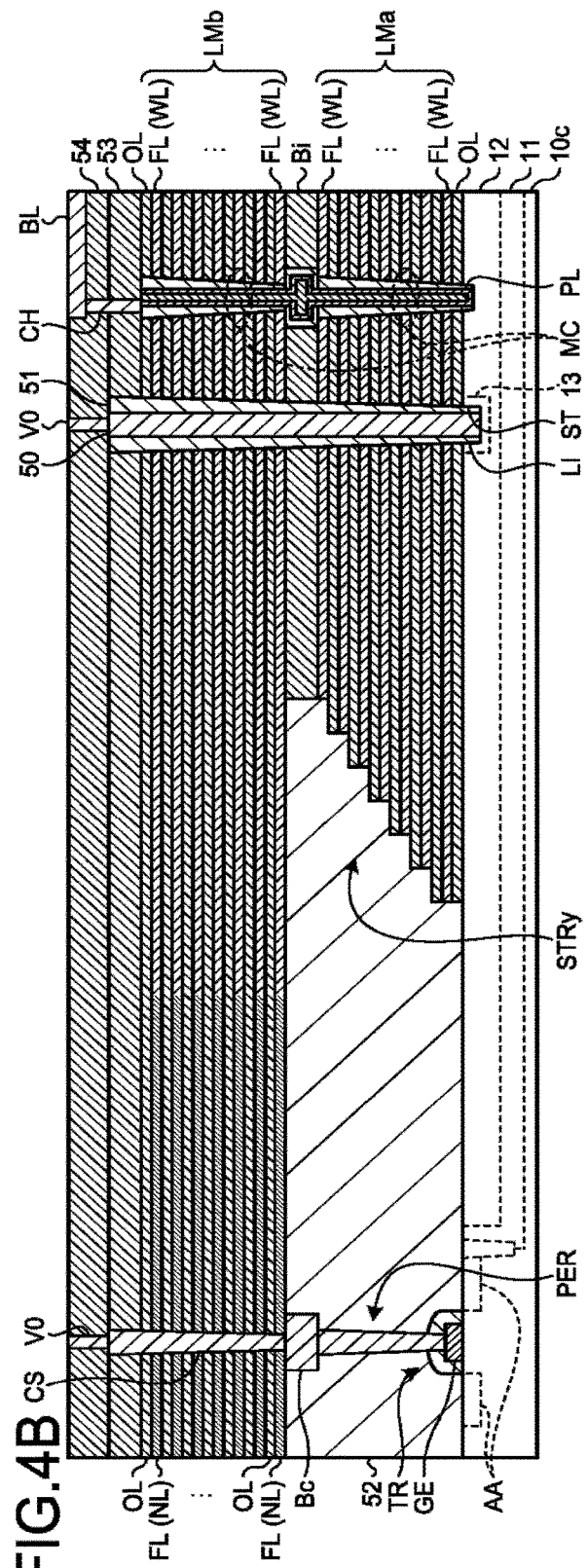

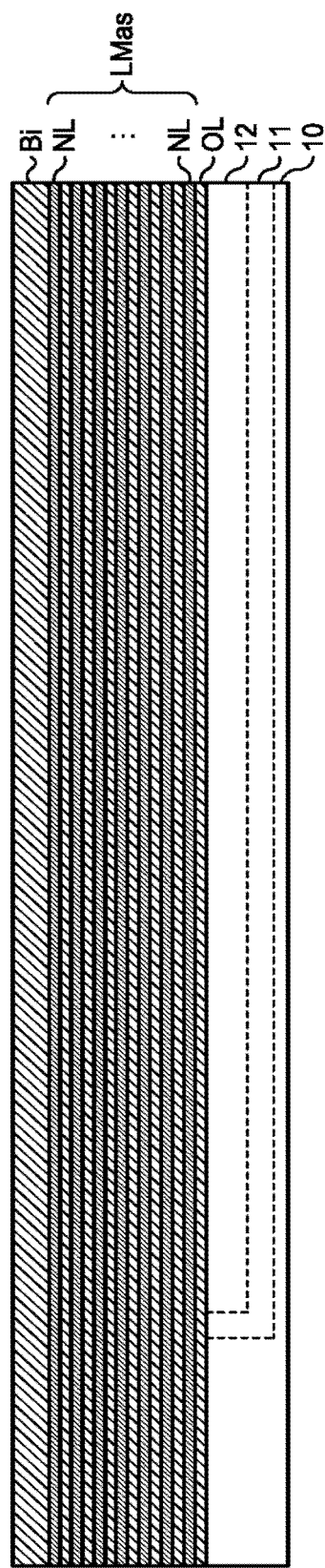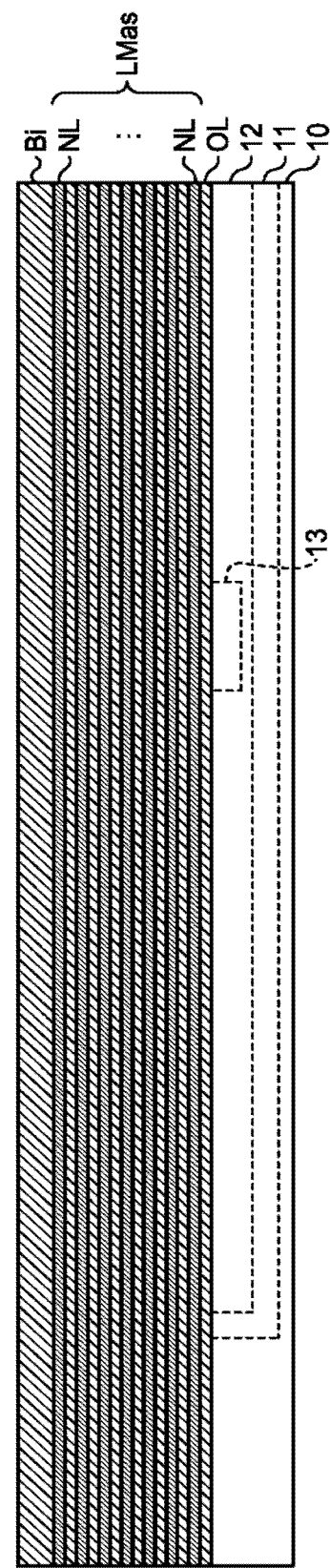

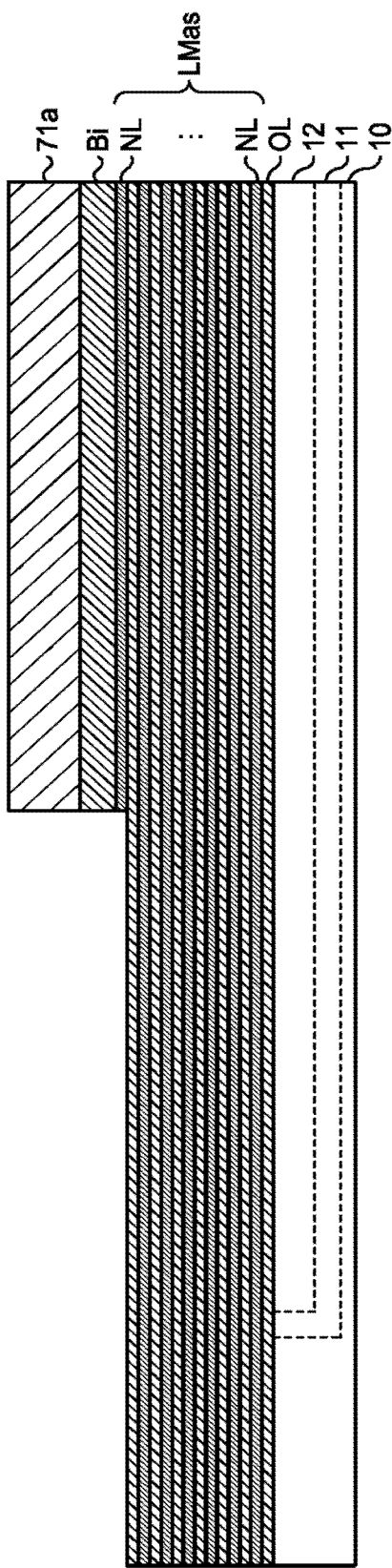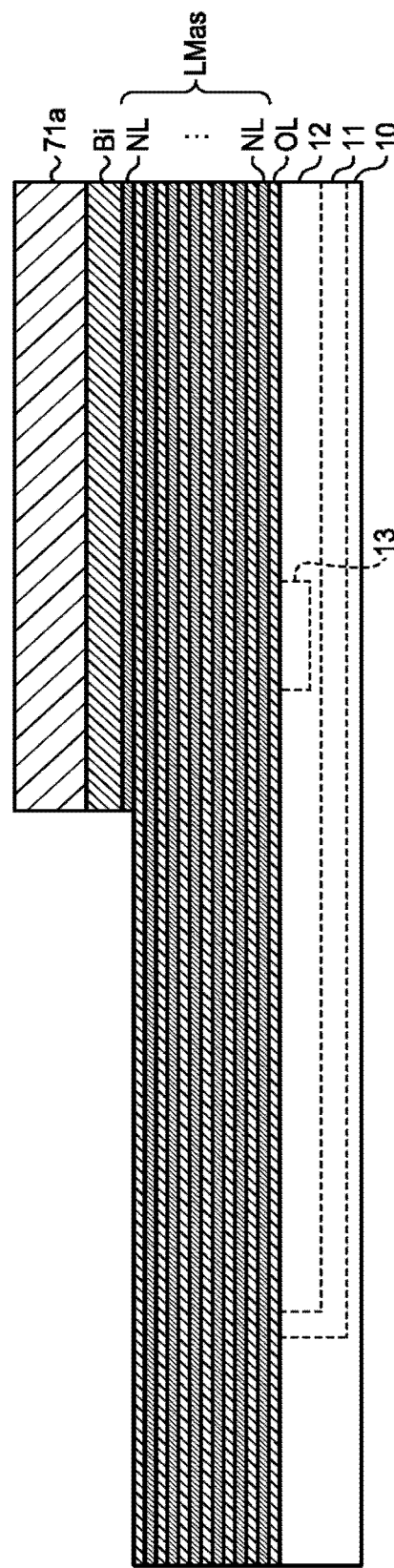

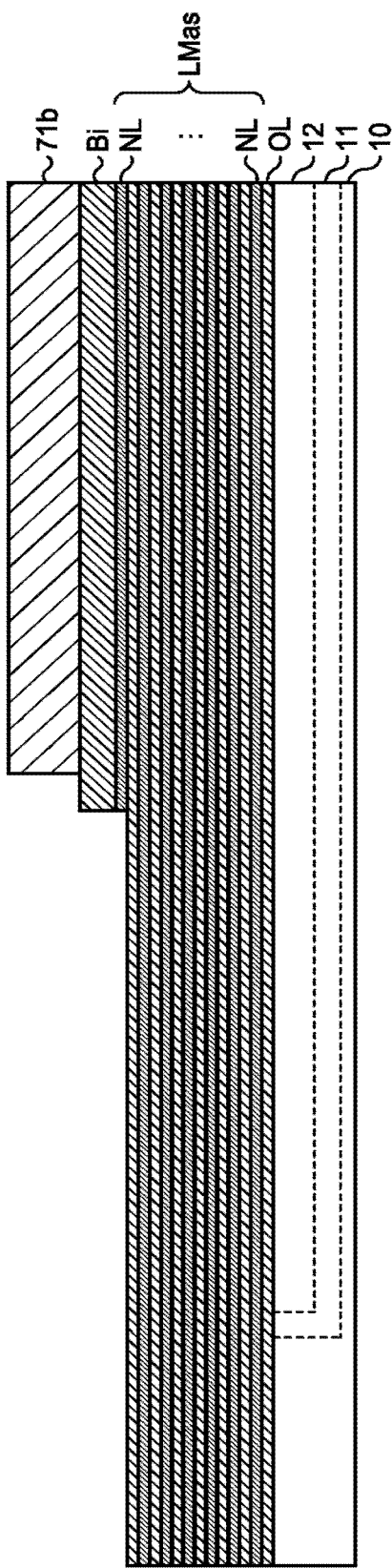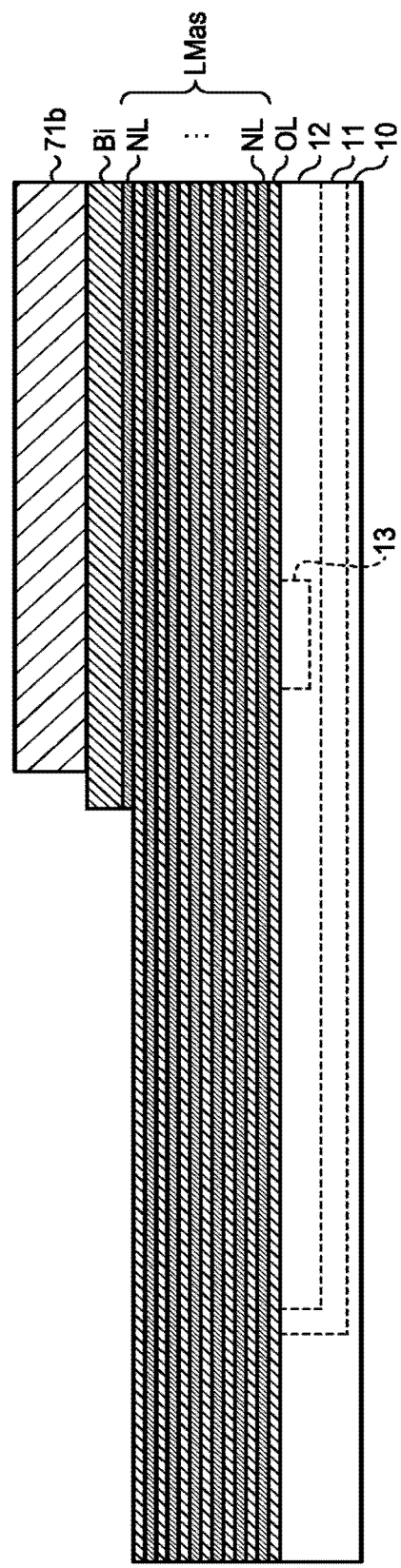

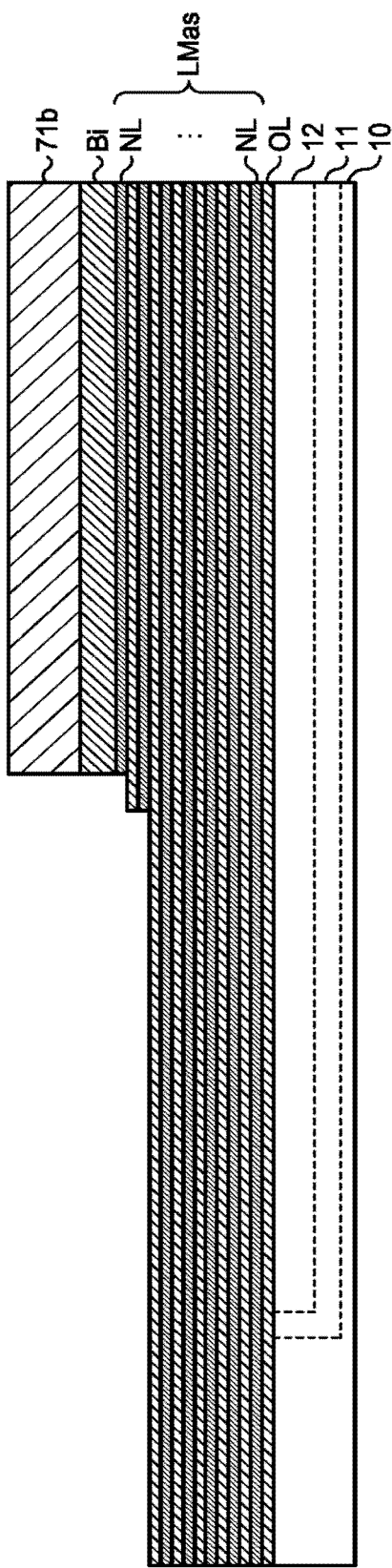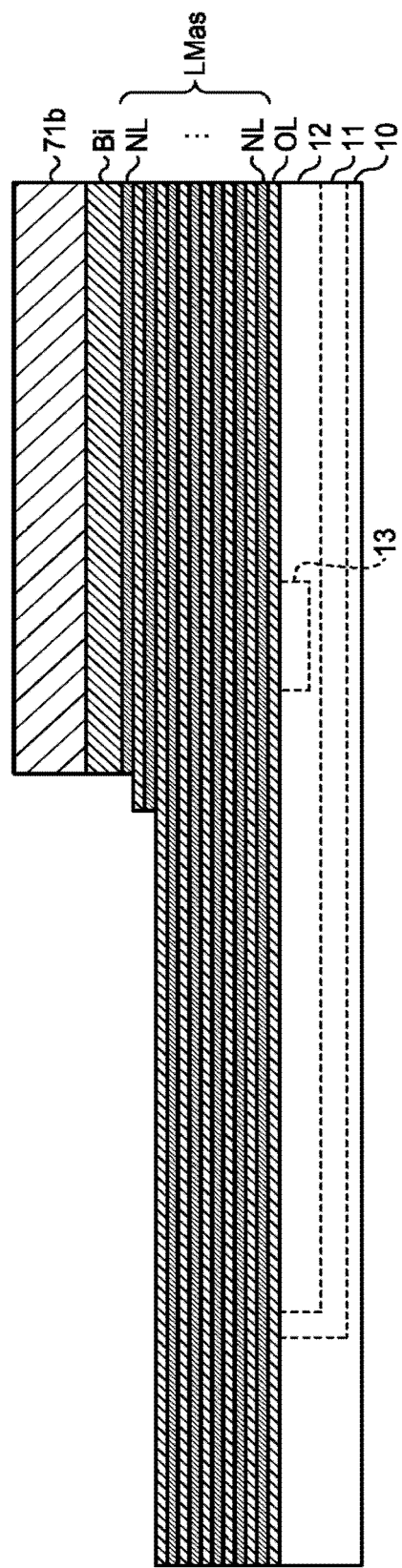

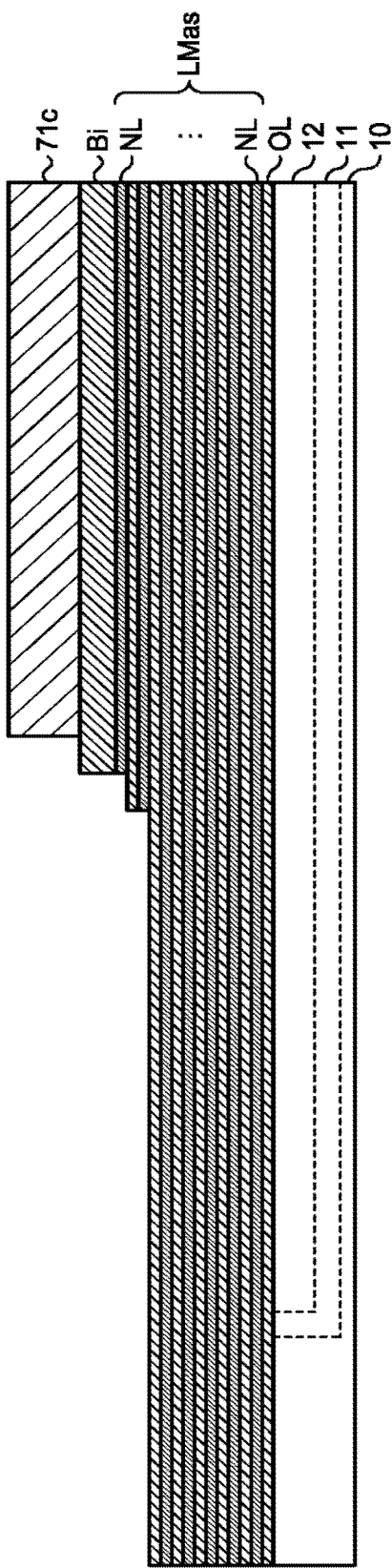
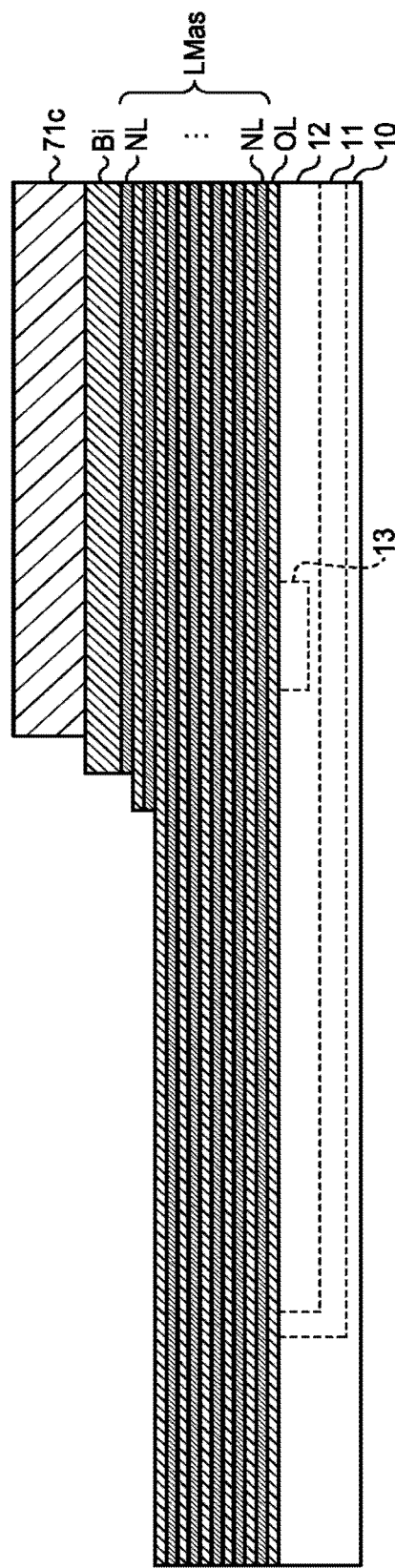

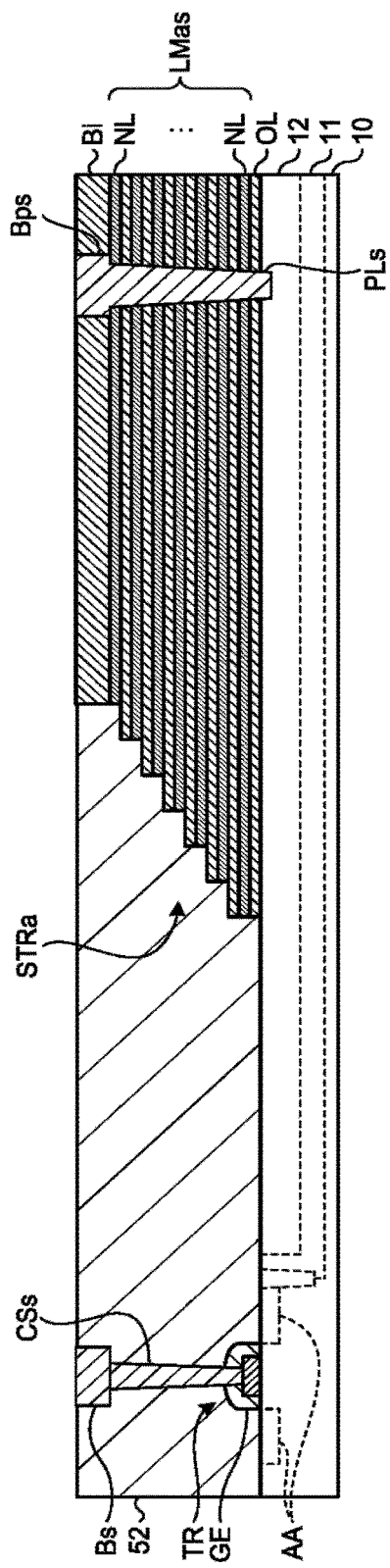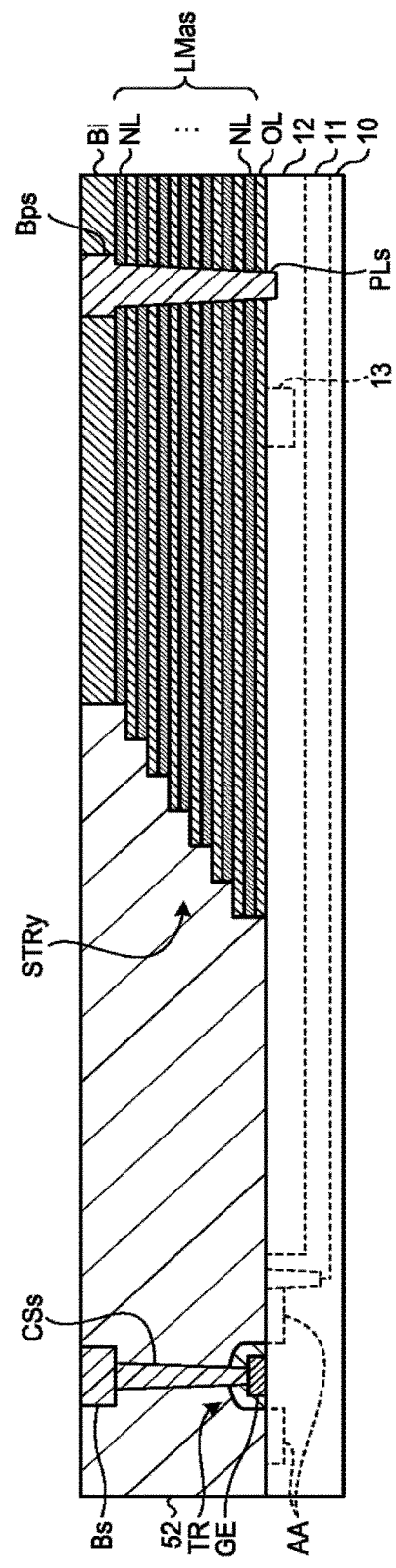

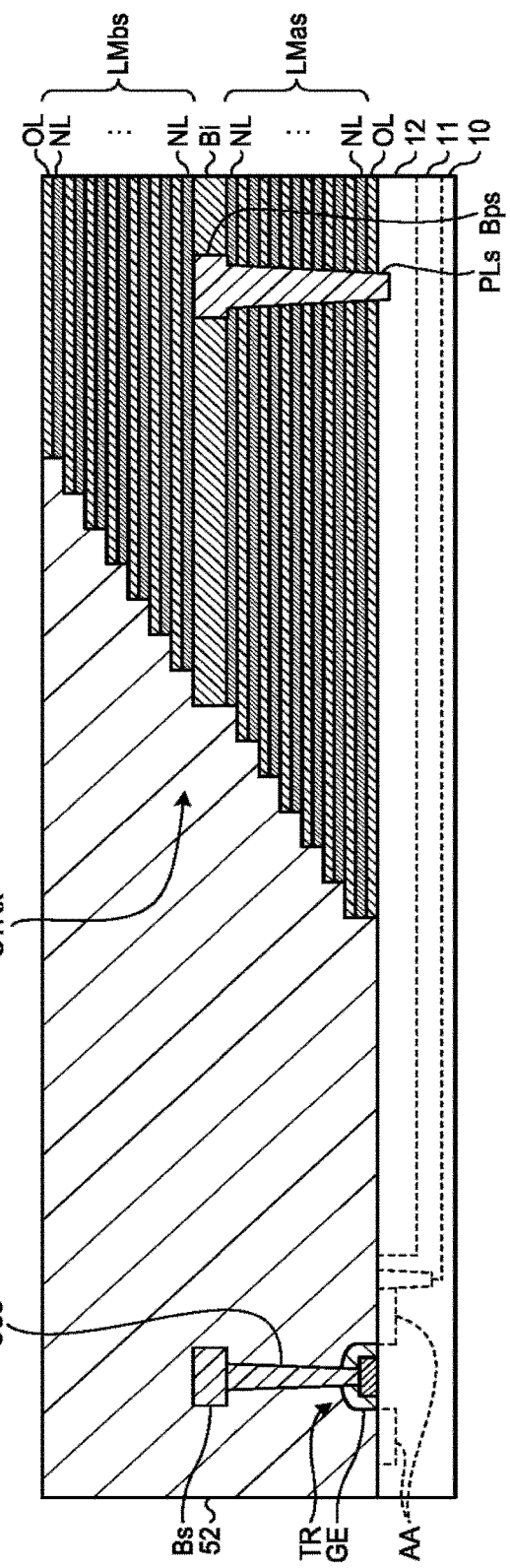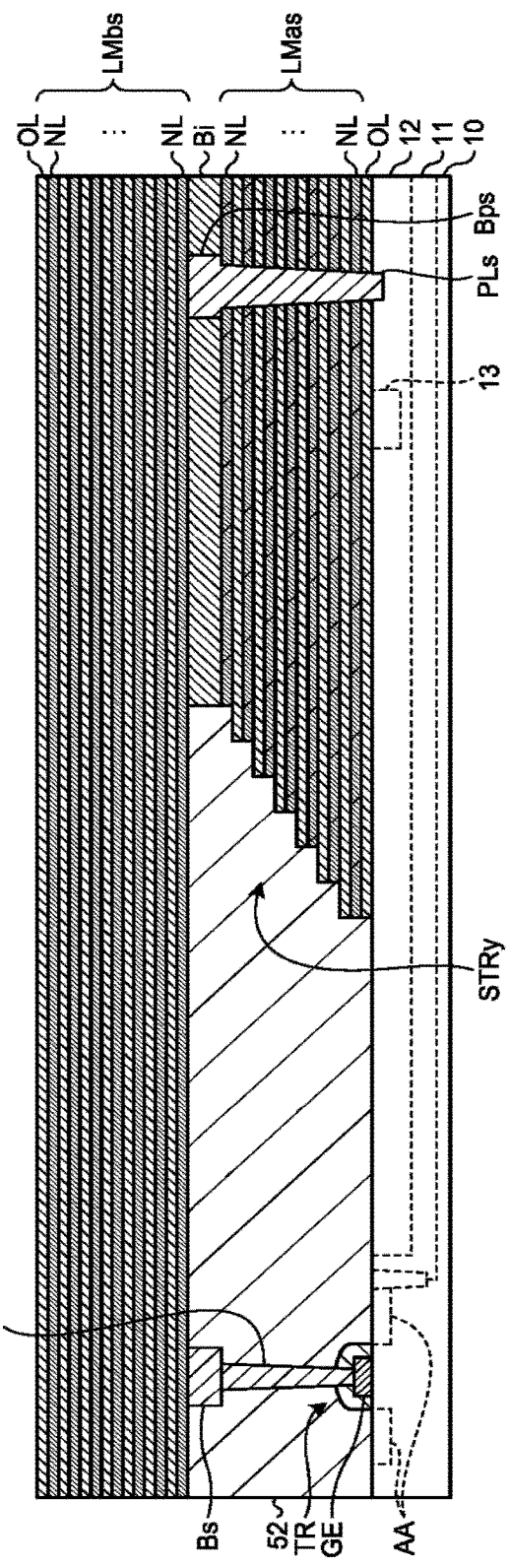

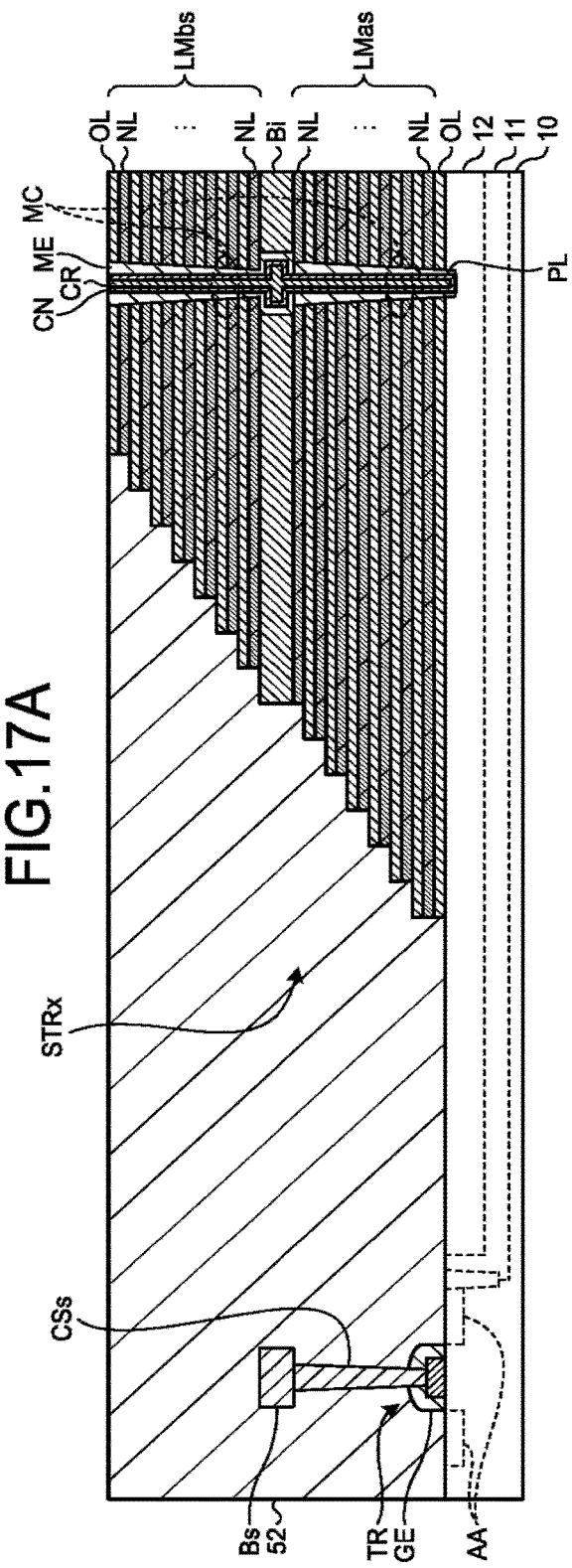
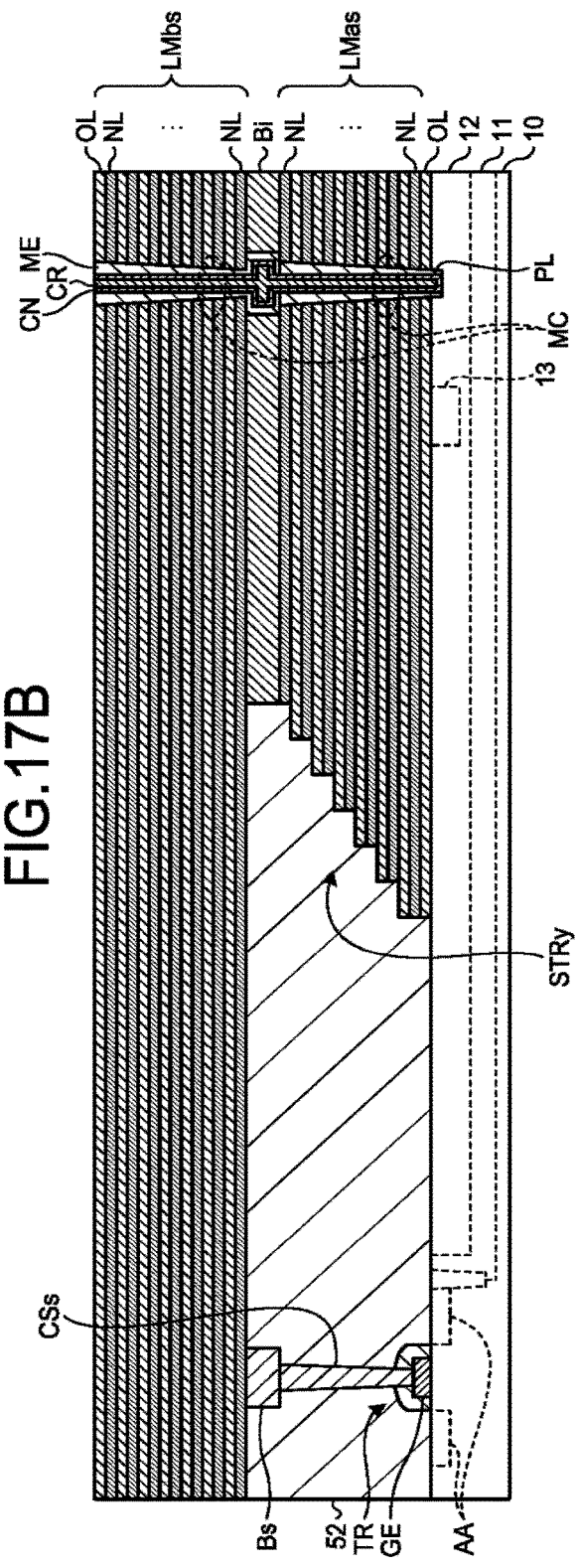

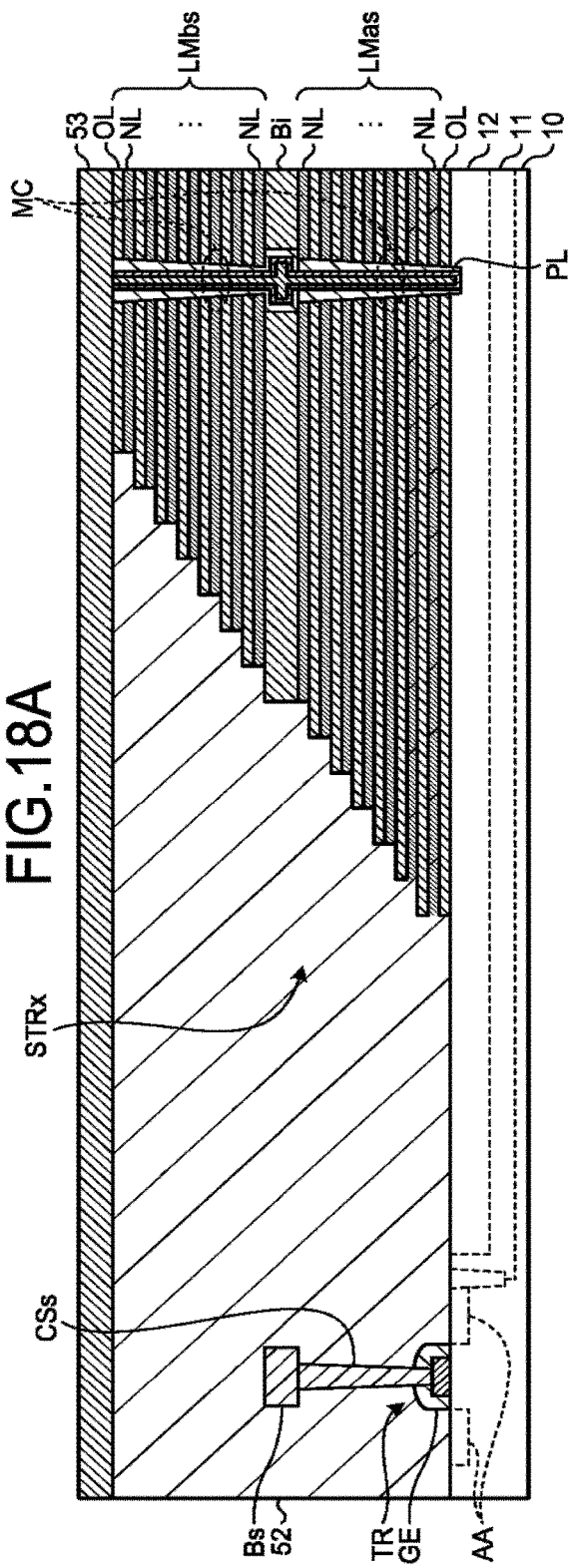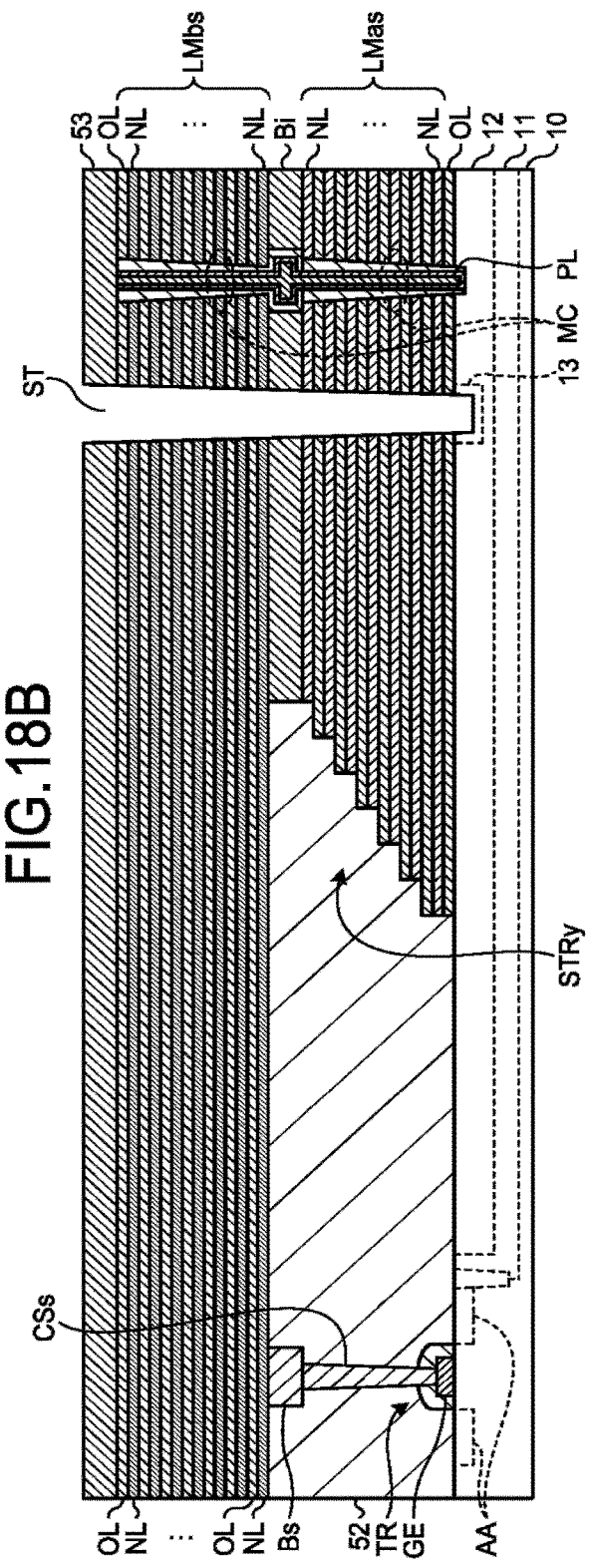

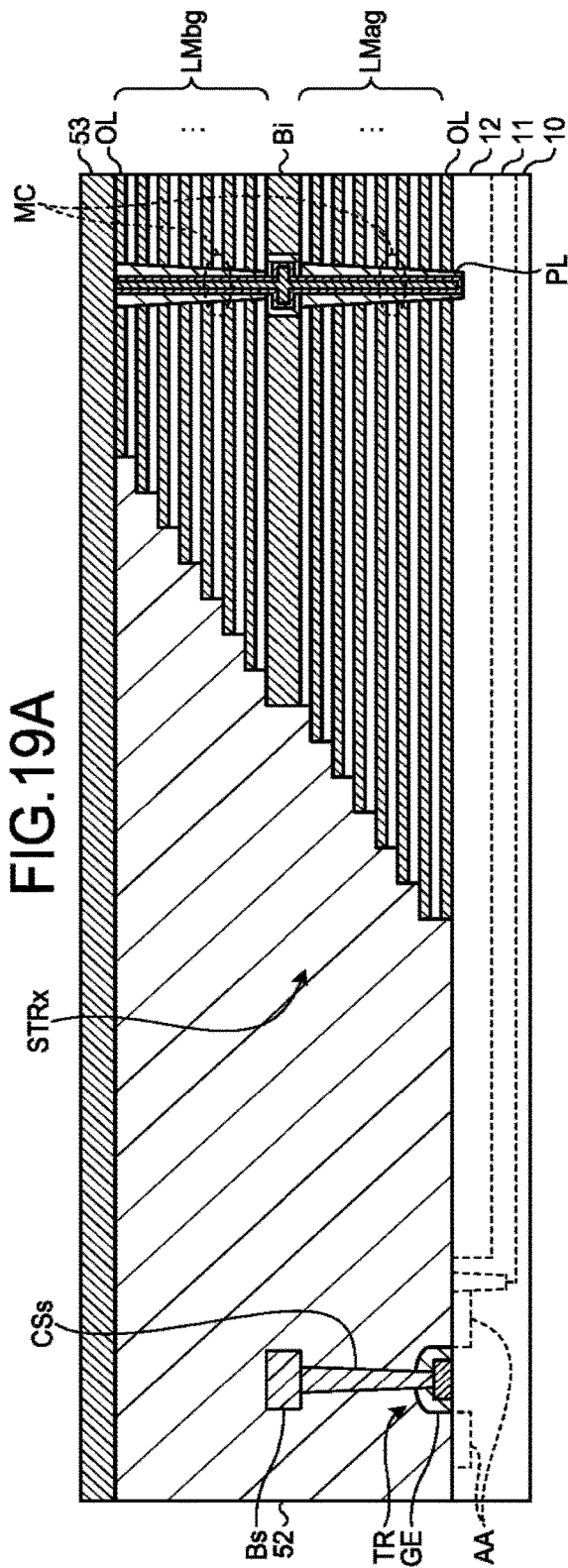
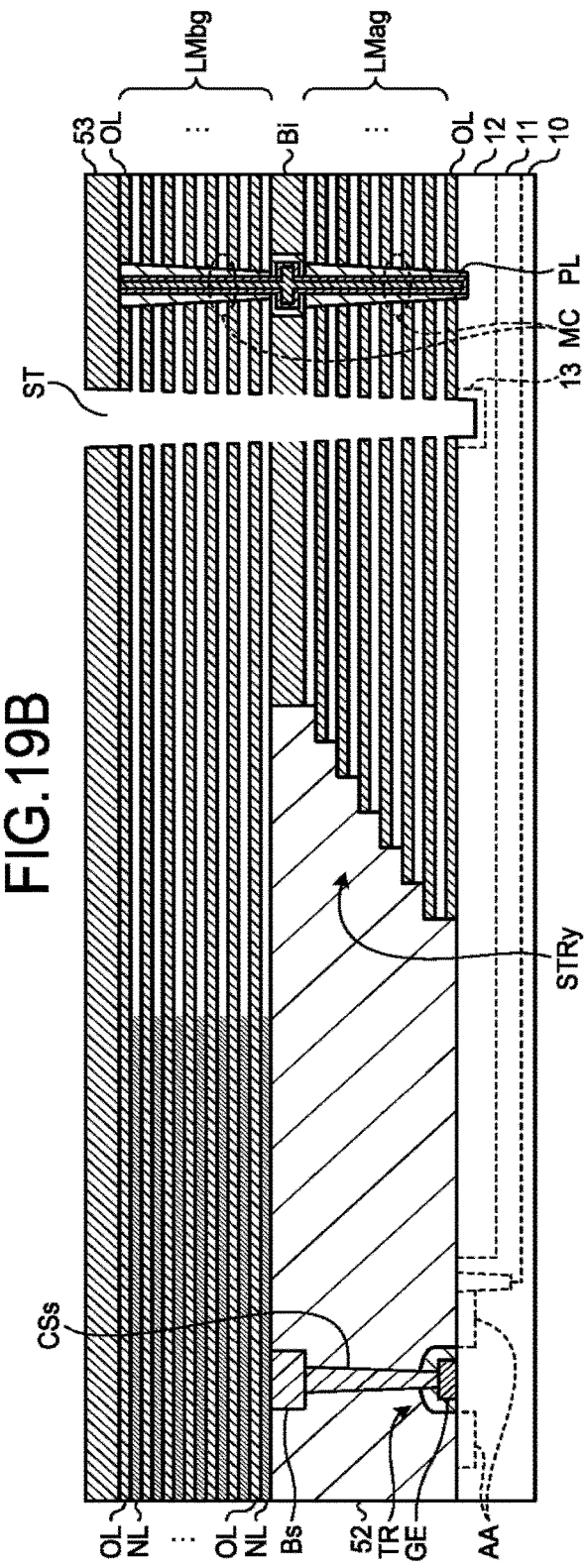

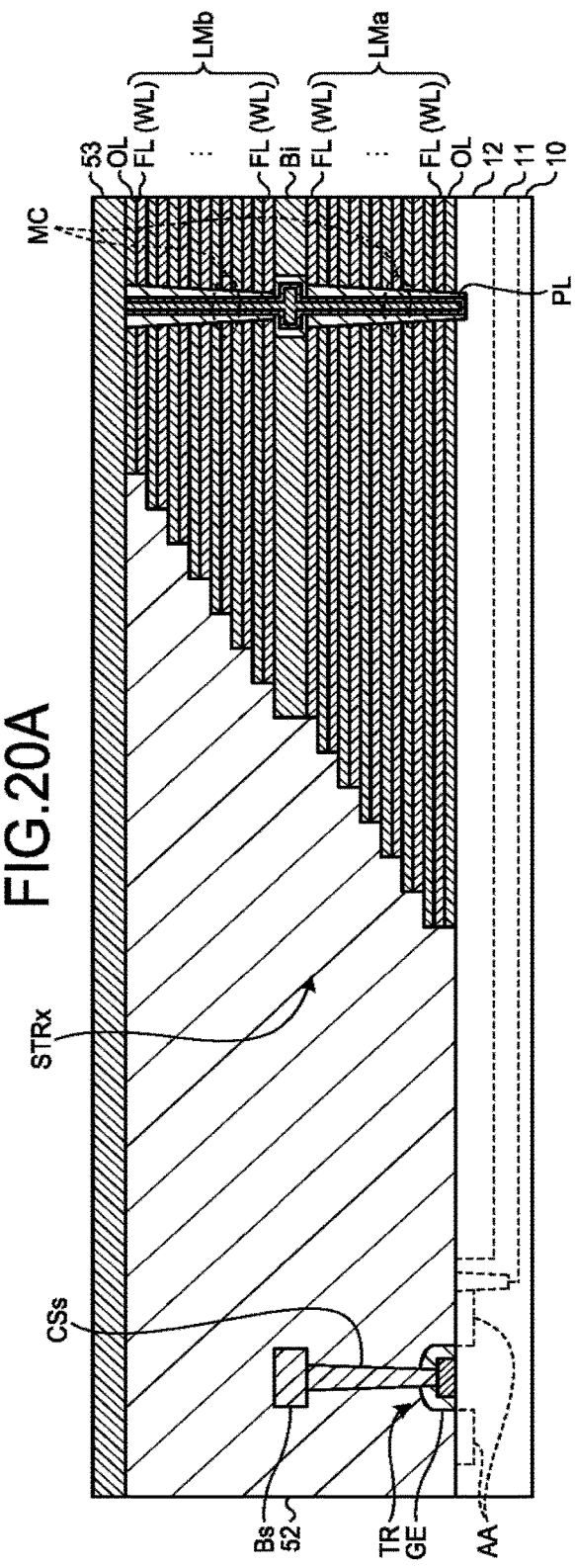
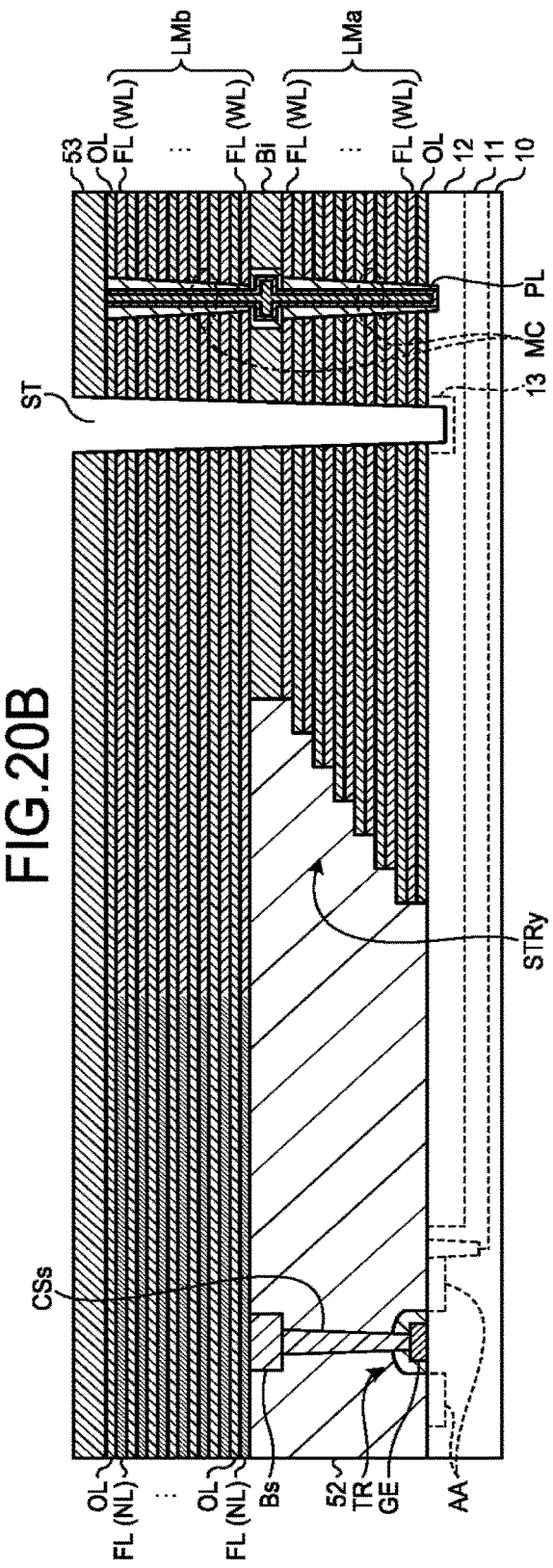
FIG.20A
FIG.20B

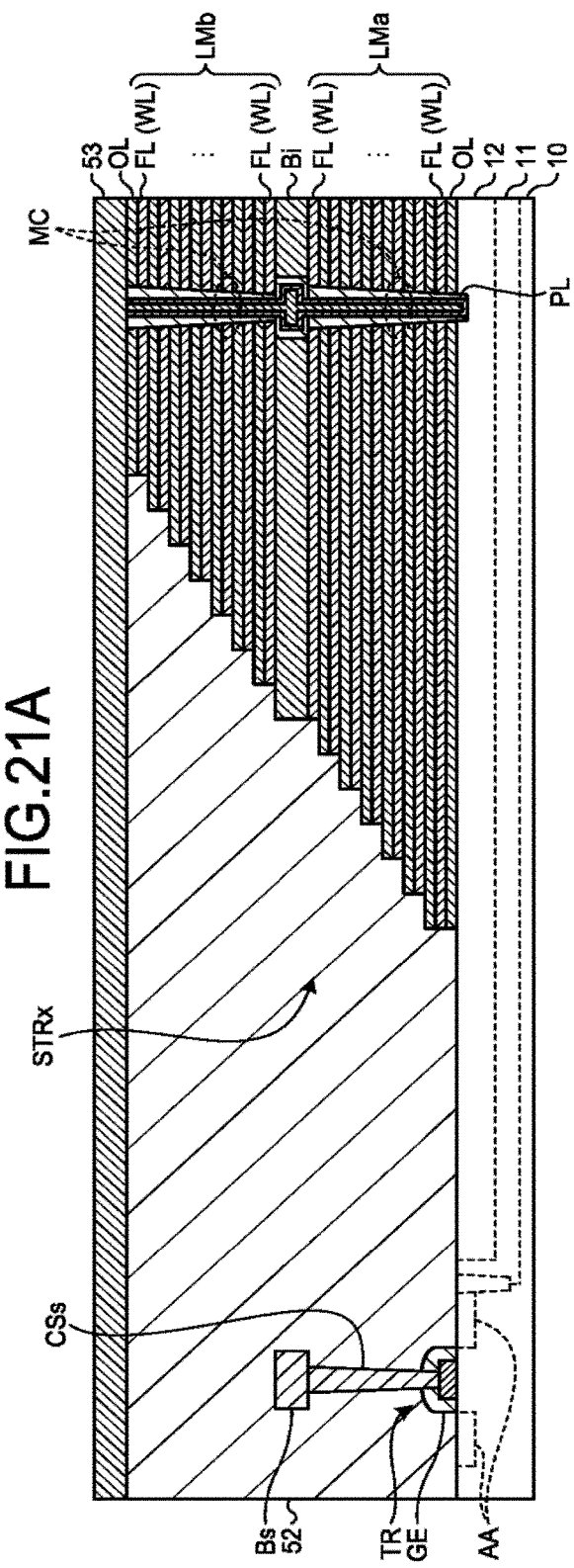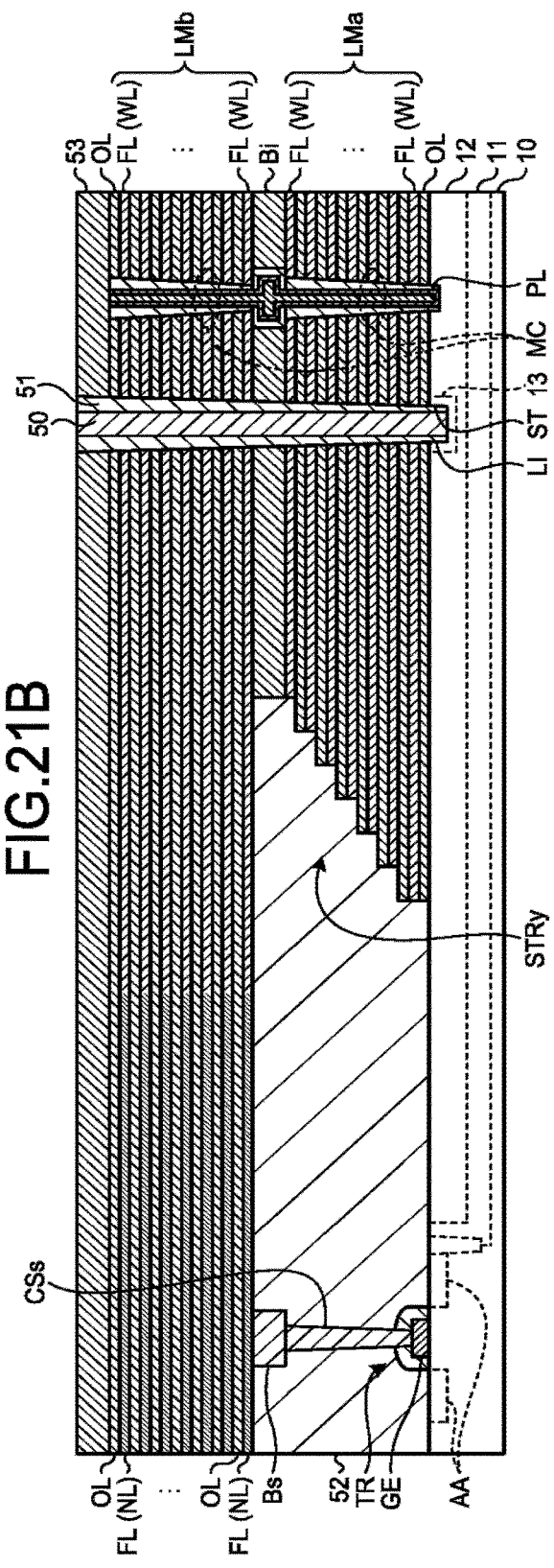

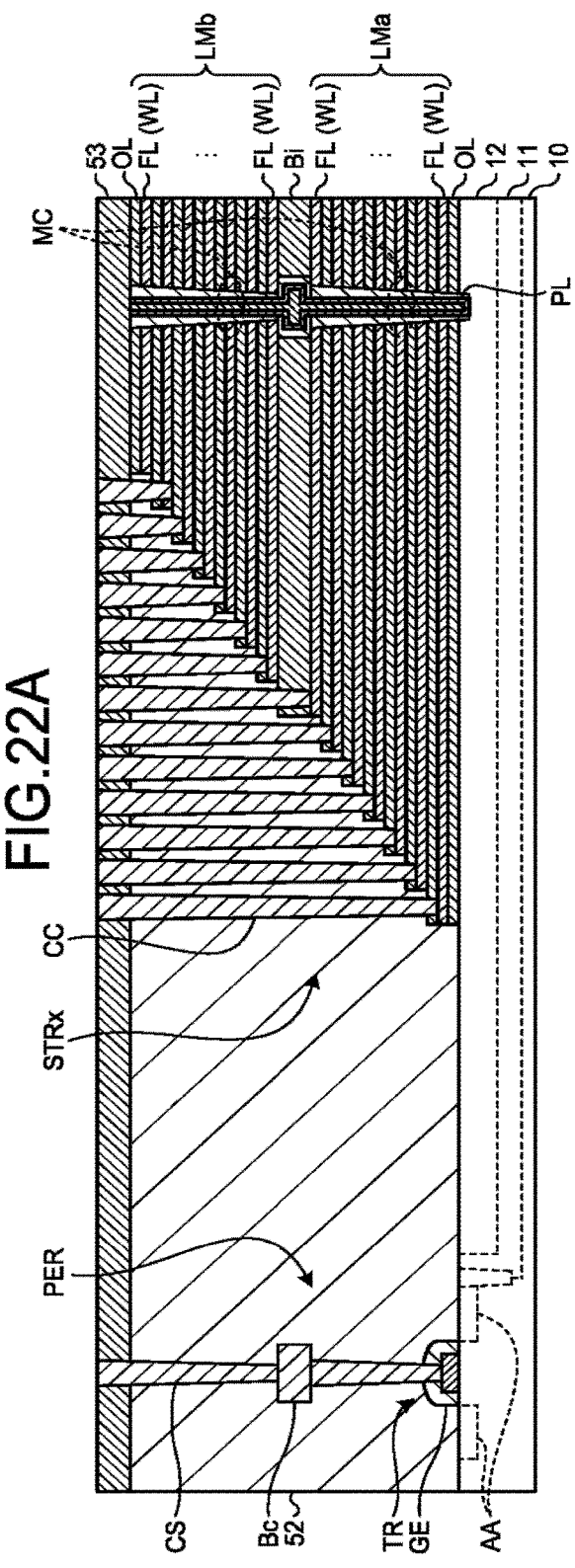
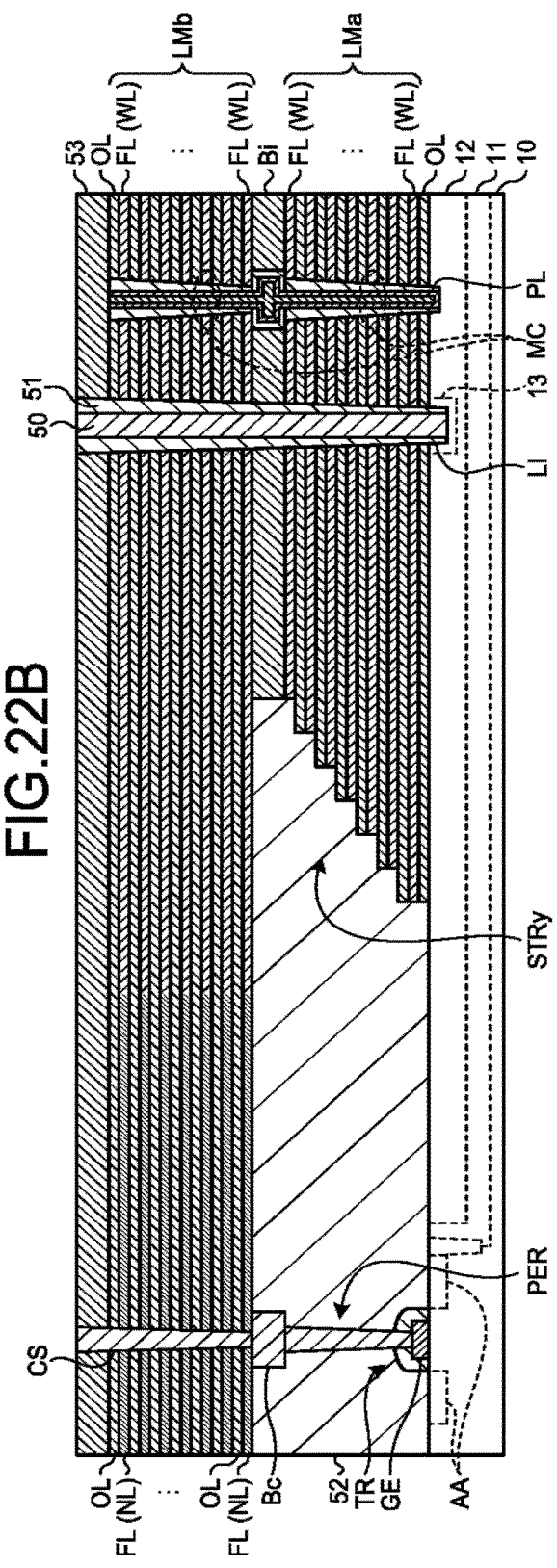

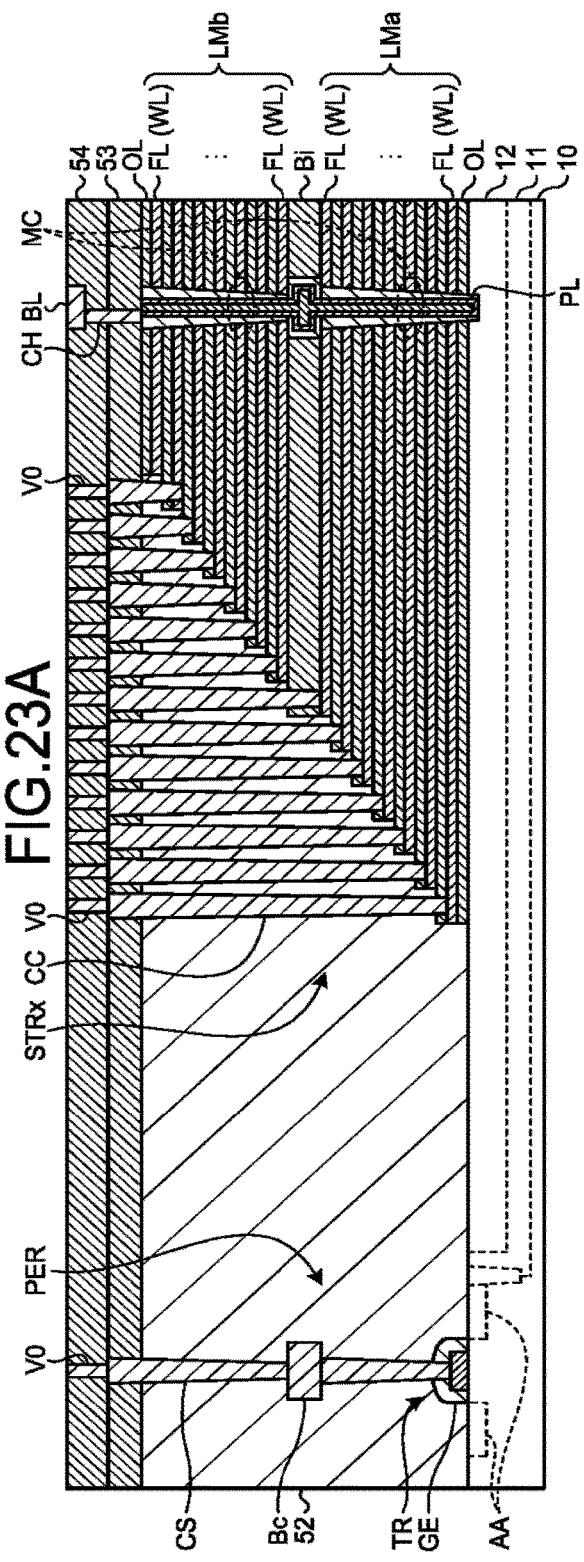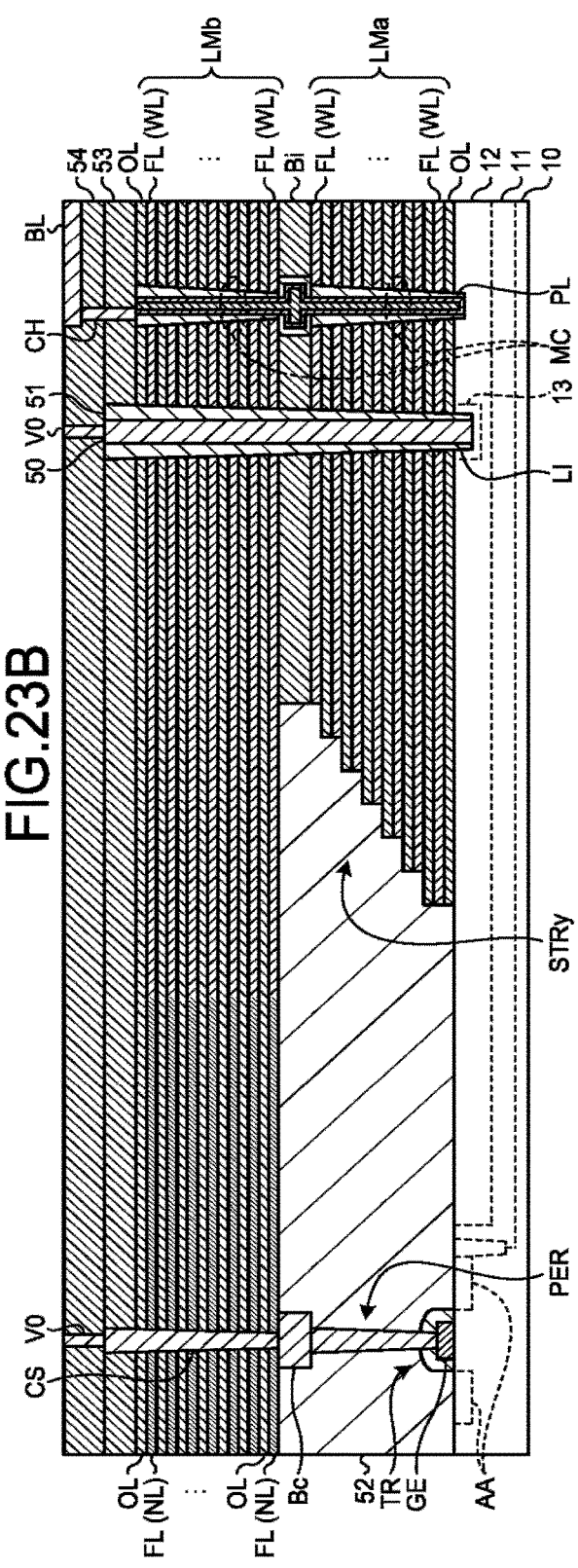

SEMICONDUCTOR MEMORY DEVICE

CROSS-REFERENCE TO RELATED APPLICATIONS

This application is a continuation of and claims benefit under 35 U.S.C. § 120 to U.S. application Ser. No. 16/505,851, filed on Jul. 9, 2019, which is based upon and claims the benefit of priority under 35 U.S.C. § 119 from Japanese Patent Application. No. 2019-037445, filed on Mar. 1, 2019, the entire contents of each of which are incorporated herein by reference.

FIELD

Embodiments described herein relate generally to a semiconductor memory device.

BACKGROUND

A three-dimensional nonvolatile memory includes memory cells arranged three-dimensionally in a stacked structure of a plurality of layers. In such a configuration, it is desired that stress Generated by a difference in materials between the stacked structure and peripheral parts surrounding the stacked structure be relaxed.

BRIEF DESCRIPTION OF THE DRAWINGS

FIGS. 4A and 4B are cross-sectional views illustrating an example of the configurations of stepped portions and a peripheral circuit of the semiconductor memory device according to the first embodiment;

FIGS. 5A and 5B are flow diagrams illustrating an example of procedures of a process of manufacturing the semiconductor memory device according to the first embodiment;

FIGS. 8A and 8B are flow diagrams illustrating an example of procedures of the process of manufacturing the semiconductor memory device according to the first embodiment;

FIGS. 9A and 9B are flow diagrams illustrating an example of procedures of the process of manufacturing the semiconductor memory device according to the first embodiment;

FIGS. 10A and 10B are flow diagrams illustrating an example of procedures of the process of manufacturing the semiconductor memory device according to the first embodiment;

FIGS. 11A and 11B are flow diagrams illustrating an example of procedures of the process of manufacturing the semiconductor memory device according to the first embodiment;

FIGS. 13A and 13B are flow diagrams illustrating an example of procedures of the process of manufacturing the semiconductor memory device according to the first embodiment;

FIG. 15 and FIGS. 15A to 15C are diagrams illustrating an example of arrangement of resist patterns in the process of manufacturing the semiconductor memory device according to the first embodiment;

FIGS. 16A and 16B are flow diagrams illustrating an example of procedures of the process of manufacturing the semiconductor memory device according to the first embodiment;

FIGS. 17A and 17B are flow diagrams illustrating an example of procedures of the process of manufacturing the semiconductor memory device according to the first embodiment;

FIGS. 18A and 18B are flow diagrams illustrating an example of procedures of the process of manufacturing the semiconductor memory device according to the first embodiment;

FIGS. 19A and 19B are flow diagrams illustrating an example of procedures of the process of manufacturing the semiconductor memory device according to the first embodiment;

FIGS. 20A and 20B are flow diagrams illustrating an example of procedures of the process of manufacturing the semiconductor memory device according to the first embodiment;

FIGS. 21A and 21B are flow diagrams illustrating an example of procedures of the process of manufacturing the semiconductor memory device according to the first embodiment;

FIGS. 22A and 22B are flow diagrams illustrating an example of procedures of the process of manufacturing the semiconductor memory device according to the first embodiment;

FIGS. 23A and 23B are flow diagrams illustrating an example of procedures of the process of manufacturing the semiconductor memory device according to the first embodiment;

DETAILED DESCRIPTION

In general, according to one embodiment, a semiconductor memory device includes a stacked structure including a plurality of first layers stacked with a second layer therebetween above a substrate having a memory region in which a plurality of memory cells are arranged and an outer edge portion surrounding the memory region, the stacked structure having a stepped portion at which ends of the first layers form a stepped shape at an end of the stacked structure in a first direction within the memory region, wherein at least some of the first layers among the plurality of first layers extend, along a second direction perpendicular to the first direction, from above the outer edge portion at a first end side of the substrate through above the memory region over the substrate to above the outer edge portion at a second end side of the substrate.

The present invention will be explained below in detail with reference to the accompanying drawings. The present invention is not limited to the following embodiments. In addition, components in the embodiment below may include those which are easily conceivable to those skilled in the art or those which are substantially the same.

First Embodiment

A semiconductor memory device according to a first embodiment will be explained with reference to FIGS. 1 to 28.

(Example of Configuration of Semiconductor Memory Device)

Figure 1:
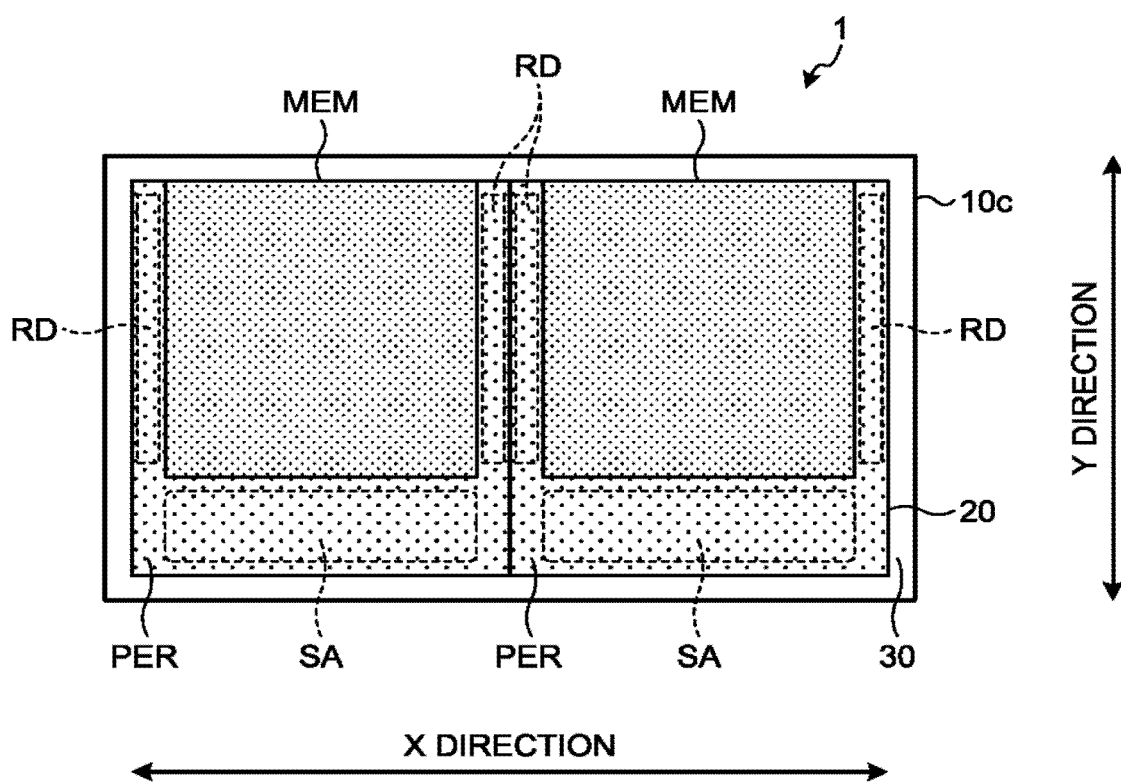
FIG. 1 is a plan view illustrating an example of arrangement of respective components of a semiconductor memory device according to a first embodiment.

FIG. 1 is a plan view illustrating an example of arrangement of respective components of a semiconductor memory device 1 according to the first embodiment; As illustrated in FIG. 1, the semiconductor memory device 1 includes a substrate 10c obtained by cutting a wafer such as a semiconductor wafer into chips.

Patterns are formed on the entire surface of the substrate 10c. Among the patterns, an element region 20 is a region in which a pattern being a semiconductor element is formed. A kerf region 30 as an outer edge portion is a region in which patterns such as alignment marks used in a process of manufacturing the semiconductor memory device 1 are formed. The element region 20 is located at the center of the substrate 10c, and the kerf region 30 is located at end portion of the substrate 10c in such a manner that the kerf region 30 surrounds the element region 20.

The element region 20 includes a memory regions MEM in which memory cells, which are storage elements, are arranged, and peripheral circuits PER that contribute to operation of the memory cells. More specifically, the peripheral circuits PER include row decoders RD arranged on both sides in the X direction of the respective memory regions MEM, for example, and sense amplifiers SA arranged on one side in the Y direction of the respective memory regions MEM, for example. The row decoders RD specify regions in which memory cells to be operated are included. The sense amplifiers SA sense data held by the memory cells.

A pair of memory region MEM and peripheral circuit PER constitutes one plane. In the example of FIG. 1, two pairs of memory region MEM and peripheral circuit PER are included in the element region 20. In other words, one substrate 10c includes two planes in the example of FIG. 1. Each of the memory regions MEM is associated with a peripheral circuit PER, which enables the memory regions MEM of a plurality of planes to operate independently of each other.

Figure 2A:
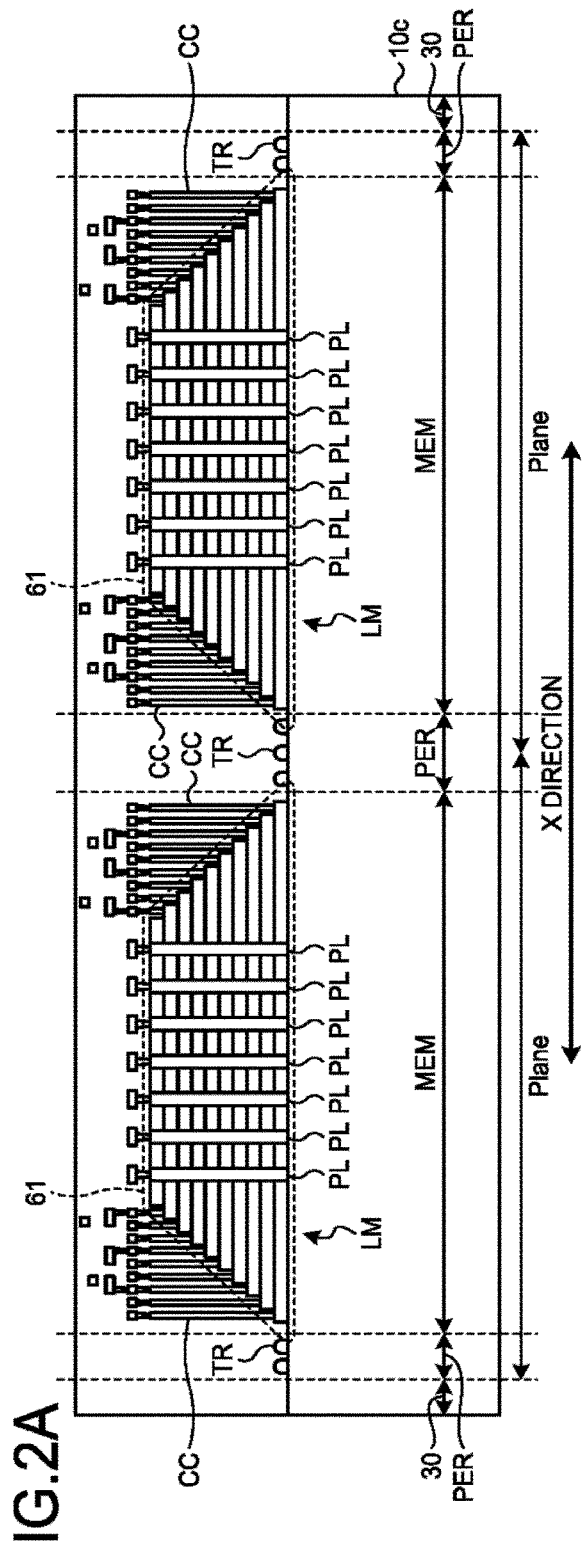
FIGS. 2A and 2B are cross-sectional views illustrating an example of the configuration of the semiconductor memory device according to the first embodiment.
Figure 2B:
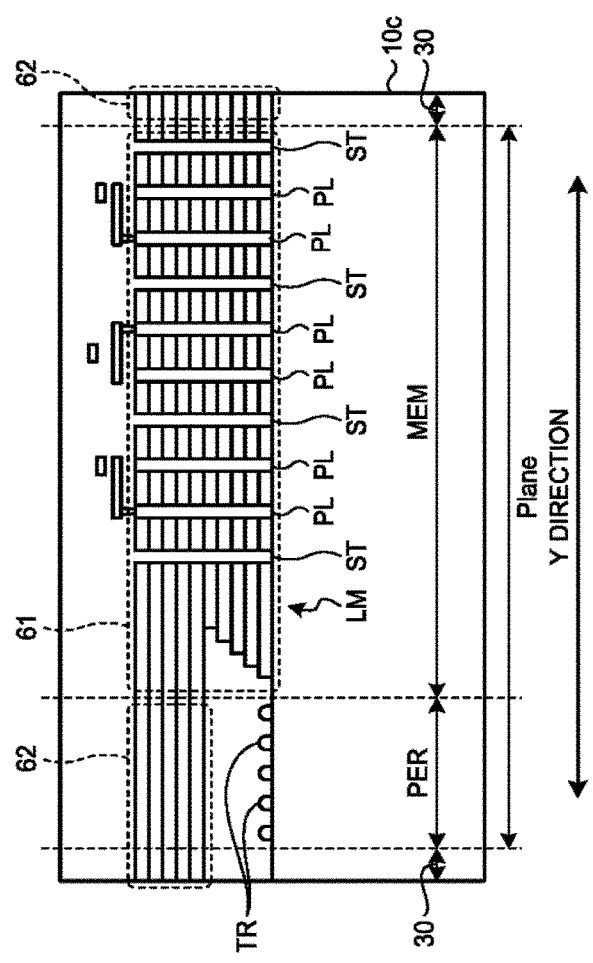

FIGS. 2A and 2B are cross-sectional view in the X direction and in the 1 direction, respectively, of the semiconductor memory device 1 according to the first embodiment.

As illustrated in the cross-sectional view in the X direction in FIG. 2A, each memory region MEM includes a stacked structure LM, in which a plurality of layers are stacked, provided on the substrate 10c. In the stacked structure LM, a plurality of pillars PL extending through the stacked structure LM are arranged. A plurality or memory cells are arranged on the side faces of the individual pillars PL along the height direction of the pillars PL. The layers in the stacked structure LM in each memory region MEM function as word lines for applying voltage to the memory cells.

At the respective ends in the X direction of each memory region MEM, the ends of the layers in the stacked structure LM are arranged in a stepped manner. This enables the ends of the word lines which are connected with individual memory cells to be drawn A contact CC for connecting an individual drawn word line with upper wiring or the like is connected with the vicinity of the end of the word line, that is, a terrace portion drawn out in the X direction relative to the word lines of upper layers.

Transistors TR and the like included in the peripheral circuits PER such as the row decoders RD, for example, are arranged outside of the memory regions MEM.

As illustrated in the cross-sectional view in the Y direction in FIG. 2B, at least some of the layers in the stacked structure LM extend from one end of the substrate 10c to the other end thereof through the memory regions MEM. In addition, in each memory regions MEM, the stacked structure LM is divided into a plurality of parts arranged in the Y direction by a plurality of slits ST as band-like portions extending through the stacked structure LM.

Transistors TR and the like included in the peripheral circuits PER such as the sense amplifiers SA, for example, are arranged on one side outside of the memory regions MEM. Only some of the layers in the stacked structure LM extend on the side on which the transistors TR are arranged; these layers extending into the regions of the peripheral circuits PER pass above the transistors TR. This allows space for the transistors TR.

The layers in the stacked structure LM are made of different materials in different regions on the substrate 10c, and thus include conducting regions 61 and insulating regions 62. In the memory regions MEM, the conducting regions 61 constituted by the aforementioned word lines are arranged. The insulating regions 62 constituted by insulating layers are arranged in the regions of the peripheral circuits PER and the kerf regions 30 on the side of the peripheral circuits PER. This suppresses short-circuits between the wires or the like constituting the peripheral circuits PER and the layers. Insulating regions 62 are also preferably arranged in the kerf regions 30 on the side opposite to the side on which the peripheral circuits PER are arranged.

Figure 3:
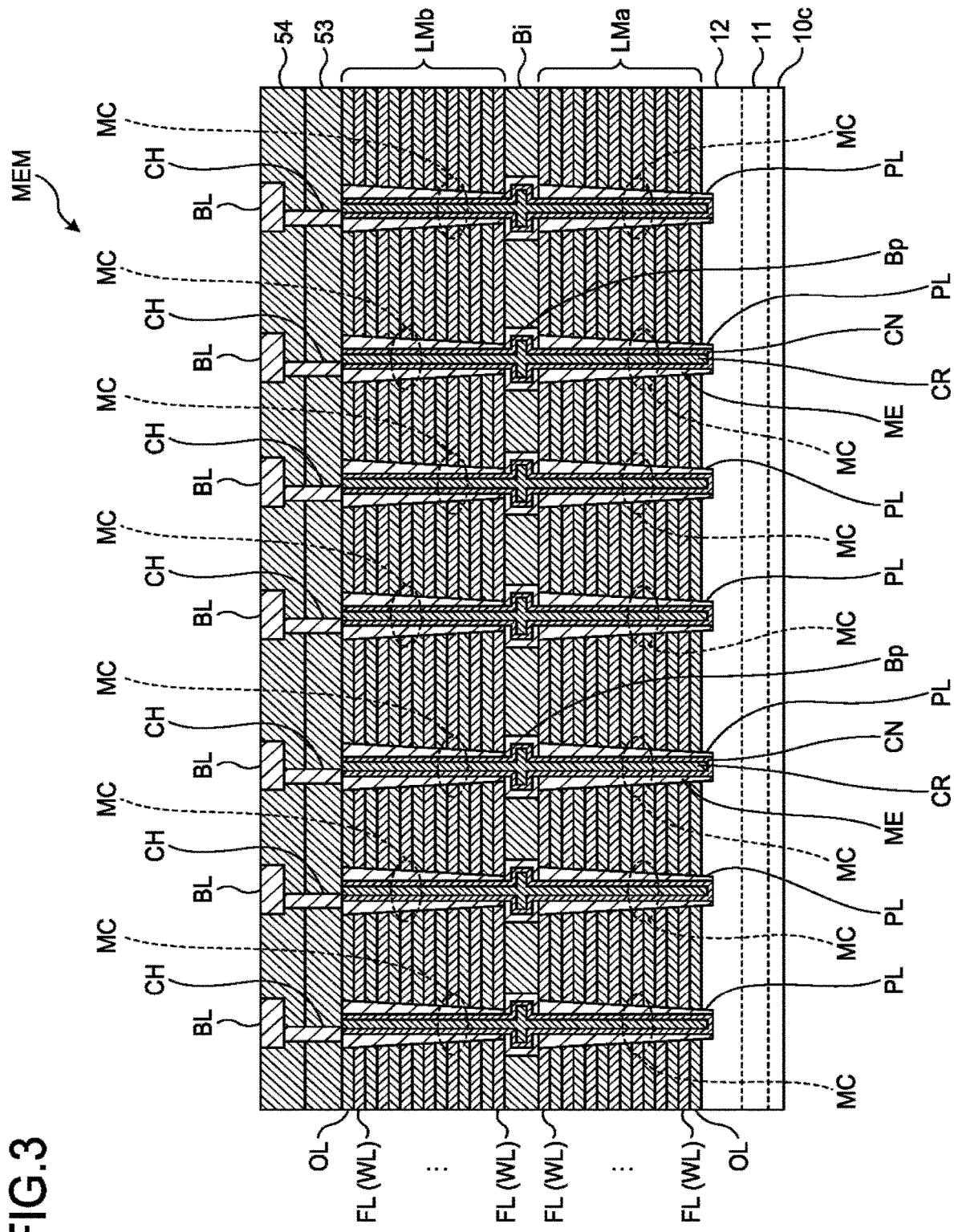
FIG. 3 is a cross-sectional view illustrating an example of the configuration of a memory region of the semiconductor memory device according to the first embodiment.

FIG. 3 is a cross-sectional view illustrating an example of the configuration of a memory region MEM of the semiconductor memory device 1 according to the first embodiment. FIG. 3 illustrates a cross-sectional view in the X direction.

As illustrated in FIG. 3, the semiconductor memory device 1 includes the substrate 10c made of silicon or the like, for example. The substrate 10c includes an n-well 11 at the surface layer, and a p-well 12 in the n-well 11.

A stacked structure LMa in which a plurality of first layers FL and a plurality of insulating layers CL as second layers are alternately stacked is provided on the substrate 10c. A stacked structure LMb in which a plurality of first layers FL and a plurality of insulating layers OL as second layers are alternately stacked is provided on the stacked structure LMa with a bonding layer Bi therebetween. The first layers FL are constituted by conducting layers such as tungsten layers or molybdenum layers in the memory regions MEM. In other words, the conducting regions 61 (see FIGS. 2A and 2B) arranged in the memory regions MEM are constituted by the conducting layers. Thus, the first layers FL function as word lines WL in the memory regions MEM. The insulating layer OL and the bonding layer Bi are $SiO_2$ layers or the like, for example.

While the stacked structures LMa and LMb each include seven layers of word lines WL in the example of FIG. 3, the number of layers of the word lines WL may be any number. In addition, the stacked structure LMa may include a select gate line (not illustrated) below the word line WL of the lowest layer, and the stacked structure LMb may include a select Gate line (not illustrated) above the word line WL of the top layer.

A plurality of pillars PL are arranged in the stacked structures LMa and LMb. The pillars Pt each extend through the stacked structures LMa and LMb and the bonding layer Bi, and are arranged in a matrix in the memory regions MEM including the stacked structures LMa and LMb. The pillars PL each has a bonding portion Bp in the bonding layer Bi. The pillars PL each includes a memory layer ME, a channel layer CN, and a core layer CR in this order from the outer side of the pillar PL. The channel layer CM is also present at the bottom of each of the pillars PL. The memory layer ME is a layer in which $SiO_2SiN/SiO_2$ layers are stacked, for example, the channel layer CN is an amorphous silicon layer, a polysilicon layer or the like, for example, and the core layer CR is an $SiO_2$ layer or the like, for example. Because the pillars PL each include a memory layer ME and a channel layer CN, a plurality of memory cells MC are formed at the respective intersections of the pillars PL and the word lines WL.

As described above, the semiconductor memory device 1 is configured as a three-dimensional nonvolatile memory in which the memory cells MC are arranged three-dimensionally in the memory regions MEM, for example.

An insulating layer 53 is provided on the stacked structure LMb. An insulating layer 54 is provided on the insulating layer 53. The channel layer CN of each pillar PL is connected with a bit line BL provided in the insulating layer 54, for example, by a plug CH extending through the insulating layers 53 and 54.

FIGS. 4A and 4B are cross-sectional views illustrating an example of the configurations of stepped portions STRx and STRy and a peripheral circuit PER of the semiconductor memory device 1 according to the first embodiment.

FIG. 4A is a cross-sectional view in the X direction of the stepped portion STRx located at ends of the stacked structures LMa and LMb in the X direction and the peripheral circuit PER located at the outer side of the stepped portion STRx. As illustrated in FIG. 4A, the stacked structures LMa and LMb of the semiconductor memory device 1 have the stepped portions STRx, where the ends of the first layers FL and the insulating layers OL as second layers are arranged in a stepped manner, at both ends in the X direction Each of the steps of the stepped portions STRx is constituted by one first layer FL and one insulating layer OL on this first layer FL, for example. At the stepped portions STRx as well, the first layers FL are conducting regions 61 (see FIGS. 2A and 2B) that function as word lines WL. Note that, in a case where select gate lines are provided above and below the stacked structures LMa and LMb, the select gate lines may also be included in the stepped portions STRx.

The respective steps of the stepped portions STRx are covered with the insulating layer 52 having a top surface at a height substantially equal to that of the top surface of the stacked structure LMb, for example. The insulating layer 53 is provided on the insulating layer 52 covering the stepped portions STRx. The insulating layer 54 is provided on the insulating layer 53.

The word line WL of each of the steps of the stepped portions STRx is connected with a contact CC extending through the insulating layers 53 and 52 covering the stepped portions STRx and the insulating layer OL, that is an upper layer of the connected word line WL. The upper end of each of the contacts CC is connected with a plug V0 extending through the insulating layer 54. The plugs V0 are connected with upper wiring or the like, for example.

The pillars PL are provided on the inner side of the stepped portions STRx as described above.

Peripheral circuits PER including transistors TR, for example, are provided in peripheral regions of the stepped portions STRx. A transistor TR includes a gate electrode GE provided on the substrate 10c, and active areas AA formed on the surface layer of the substrate 10c on the respective sides of the gate electrode GE. The gate electrode GE is connected with a contact CS extending through the insulating layers 53 and 52 covering the peripheral circuits PER to the gate electrode GE. The contact CS has a bonding portion Bc at a position at the same height as the bonding layer Bi between the stacked structures LMa and LMb. The contact CS is connected with a plug V0 extending through the insulating layer 54. The plug V0 is connected with upper wiring or the like, for example. In the peripheral circuits PER, contacts (not illustrated) extending through the insulating layers 53 and 52 to the active areas AA may be further formed.

In addition, in the Y direction, at least part of the stacked structures LMa and LMb of the semiconductor memory device 1 extends from one end of the substrate 10c through the memory regions MEM to the other end of the substrate 10c as described above. More specifically, the stacked structure LMb among the stacked structures LMa and LMb extends from one end to the other of the substrate 10c. The ends of the stacked structure LMb on both sides in the Y direction are not stepped at the ends of the memory regions MEM, but are sheer and substantially perpendicular to the surface of the substrate 10c at the ends of the substrate 10c. In contrast, the stacked structure LMa, among the stacked structures LMa and LMb, does not extend to the peripheral circuit PER but ends at the end of the memory region MEM and forms the stepped portion STRy on the side on which the peripheral circuit PER is provided in the Y direction, and the stacked structure LMa extends to the end of the substrate 10c and ends in a sheer manner with the stacked structure LMb on the side opposite to the side on which the peripheral circuit PER is provided in the Y direction.

FIG. 4B is a cross-sectional view in the Y direction of the stepped portion STRy located at the ends of the memory region MEM of the stacked structure LMa in the Y direction and the peripheral circuit PER located at the outer side of the stepped portion STRy. As illustrated in FIG. 4B, the stacked structure LMa has the stepped portion STRy, where the first layers FL and the insulating layers OL as second layers are arranged an a stepped manner at the end of the memory region MEM on the side on which the peripheral circuit PER is provided in the Y direction Each of the steps of the stepped portion STRy is constituted by one first layer FL and one insulating layer OL on this first layer FL, for example. At the stepped portions STRy as well, the first layers FL are conducting regions 61 (see FIGS. 2A and 2B) that function as word lines WL. Note that, in a case where a select gate line is provided below the stacked structure LMa, the select gate line may also be included in the stepped portion STRy.

The pillars Pt are provided on the inner side of the stepped portion STRy as described above. In addition, a plurality of slits ST are provided in the region in which the pillars PL are provided. The slits ST each have a band-like structure extending in the X direction through the insulating layer 53 covering the stacked structures LMa and LMb and the stacked structures LMa and LMb, and divides the stacked structures LMa and LMb in the Y direction Each of the slits ST is filled with a conducting layer 50 such as tungsten, with an insulating layer 51 such as an SiO$_2$ layer serving as a liner, for example, and functions as a source line contact LI. Each or the source line contacts LI is provided in an n$^+$ diffusion region 13 provided on the substrate 10c, and has an upper end connected with a plug V0 extending through the insulating layer 54 covering the insulating layer 53. The plug V0 is connected with upper wiring or the like. Note that the slits ST need not function as the source line contacts LI, and in this case, each of the slits ST may be filled with an SiO$_2$ layer, an SiN layer, or the like.

A peripheral circuit PER including a transistor TR, for example, is provided in a peripheral region of the stepped portion STRy. The transistor TR includes a gate electrode GE provided on the substrate 10c, and active areas AA formed on the surface layer of the substrate 10c on the respective sides of the gate electrode GE. The gate electrode GE is connected with a contact CS. The contact CS has a bonding portion Bc at a position at the same height as the bonding layer Bi between the stacked structures LMa and LMb. The contact CS is connected with a plug V0 extending through the insulating layer 54 that is an upper layer of the contact CS. The plugs V0 are connected with upper wiring or the like, for example. In the peripheral circuit PER in the peripheral region of the stepped portion STRy as well, contacts (not illustrated) connected with the active areas AA may be further formed.

The stepped portion STRy and the transistor TR and the like of the peripheral circuit PER are covered with the insulating layer 52 having a top surface at a height substantially equal to that of the top surface of the bonding layer Bi between the stacked structures LMa and LMb, for example. The stacked structure LMb in which the first layers FL and the insulating layers CL as second layers are stacked is provided on the insulating layer 52. The insulating layer 53 is provided on the stacked structure LMb, and the insulating layer 54 is provided on the insulating layer 53.

The first layers FL in the stacked structures LMb above the stepped portions STRy provided in the memory regions MEM are also conducting regions 61 (see FIGS. 2A and 2B). The stepped portion STRy located at the end of the stacked structure LMa in the Y direction is constituted by dummy steps that do not have the function of drawing word lines WL, and the word lines WI at the respective steps of the stepped portion STRy are not connected with contacts CC and the like. Thus, even when the conducting region 61 of the first layers FL is provided on the stepped portion STRy, the stacked structure LMb does not become electrically connected with the contacts CC. The stepped portion STRy constituted by the dummy steps is provided at the end of the stacked structure LMa in the Y direction, which allows space for the peripheral circuit PER including the transistor TR.

The first layers FL of the stacked structure LMb are constituted by insulating layers NL such as SiN layers within the region in which the peripheral circuit PER is provided. In other words, the insulating regions 62 (see FIGS. 2A and 2B) provided in the regions of the peripheral circuits PER are constituted by the insulating layers NL. The contact CS of the peripheral circuit PER described above extends through the stacked structure LMb and is connected with the gate electrode GE of the transistor TR. Because it is the insulating region 62 of the first layers FL that is provided on the transistor TR, the stacked structure LMb does not become electrically connected with the contact CS.

The boundary between the conducting region 61 provided in the memory region MEM and the insulating region 62 provided in the region of the peripheral circuit PER, that is, the boundary at which the materials of the first layers FL are switched is present at a position from immediately above the leading end of the stepped portion STRy of the stacked structure LMa in the Y direction to the inside of the region of the peripheral circuit PER.

The first layers FL of the stacked structure LMb also form insulating region 62 in the kerf region 30 (see FIGS. 2A and 2B) on the further outer side of the peripheral circuit PER in the Y direction. The first layers FL of the stacked structure LMb also preferably form insulating region 62 in the kerf region 30 on the side opposite to the side on which the peripheral circuit PER is provided.

(Example of Process of Manufacturing Semiconductor Memory Device)

Next, an example of a process of manufacturing the semiconductor memory device 1 of the first embodiment will be explained with reference to FIGS. 5A to 24C. FIGS. 5A to 24C are flow diagrams illustrating an example of procedures of the process of manufacturing the semiconductor memory device 1 according to the first embodiment. A and B of the same figure number excluding FIG. 6 and FIGS. 6A to 6C, FIG. 15 and FIGS. 15A to 15C, and FIGS. 24A to 24C illustrate different parts in the same processing step. A and B of each of such figures correspond to the part illustrated in FIG. 4A and the part illustrated in FIG. 4B, respectively.

As illustrated in FIGS. 5A and 5B, the n-well 11, the p-well 12, the n$^+$ diffusion region 13, and the like are formed on a wafer 10 that is a semiconductor wafer or the like before being cut into the substrate 10c. A stacked structure LMas in which a plurality of insulating layers NL and OL are alternately stacked is formed on the wafer 10. The insulating layers ML are sacrificing layers such as SiN layers that can be replaced with conducting layers such as tungsten layers or molybdenum layers that partly constitute the conducting region 61 of the first layers FL a later process. A bonding layer Bi such as an SiO$_2$ layer is formed on the stacked structure LMas.

Figures 6, 6A, 6B, 6C:
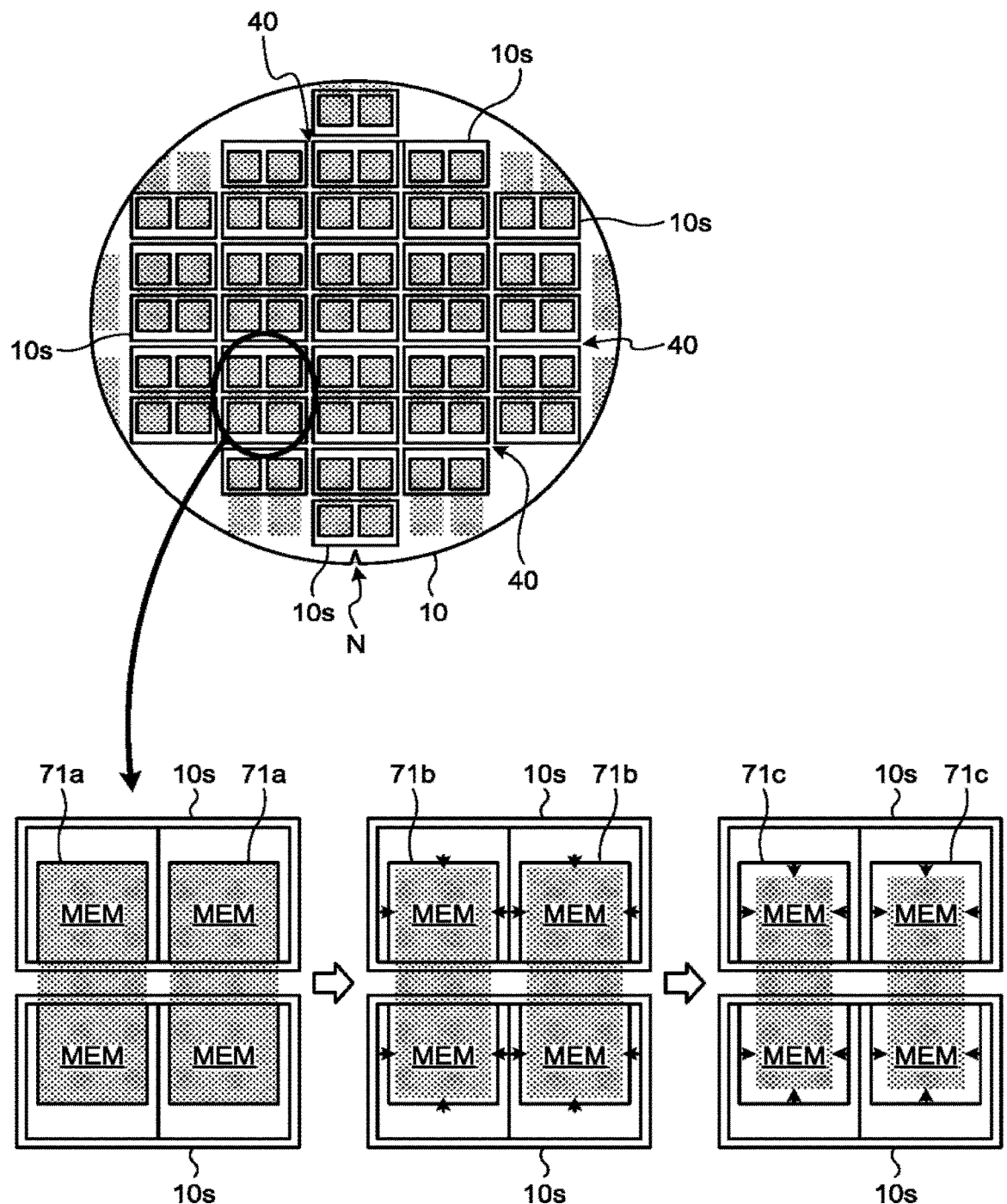
FIG. 6 and FIGS. 6A to 6C are diagrams illustrating an example of arrangement of resist patterns in the process of manufacturing the semiconductor memory device according to the first embodiment.

Thereafter, the stacked structure LMas and the bonding layer Bi formed on the wafer 10 are partly covered with resist patterns. This process is illustrated in FIG. 6. FIG. 6 is a diagram illustrating an example of arrangement of resist patterns 71a to 71c in the process of manufacturing the semiconductor memory device 1 according to the first embodiment.

As illustrated in FIG. 6, after at least some predetermined process, a plurality of chip areas 10s are arranged with scribe lines 40 therebetween on the wafer 10. The scribe lines 40 are regions included in the kerf region 30, and are to be scraped off and eliminated while the wafer 10 is subjected to dicing and cut into substrates 10c in a later process. The chip areas 10s are areas in which patterns are formed in the process of manufacturing the semiconductor memory device 1, that is, areas each including an element region 20 including memory regions MEM and peripheral circuits PER, and a kerf region 30, and substantially corresponding to the substrates 10c into which the wafer 10 is diced and cut.

The chip areas 10s are arranged in such a manner that the positions of the memory regions MEM and the peripheral circuits PER in the respective chip areas 10s are alternately reversed in the Y direction, for example. Thus, the memory regions MEM in each of the chip areas 10s on a first row in the Y direction on the side opposite to a notch N of the wafer 10 and the memory regions MEM in each of the chip areas 10s on a second row adjacent to the first row are arranged away from each other on the outer side within the respective chip areas 10s, for example. In contrast, the memory regions MEM in each of the chip areas 10s on the second row and the memory regions MEM in each of the chip areas 10s on a third row adjacent to the second row are arranged close to each other on the inner side within the respective chip areas 10s, for example. FIGS. 6A to 6C illustrate enlarged views of two chip areas 10s in which memory regions MEM are arranged close to each other.

Although the chip areas 10s are illustrated as being on the wafer 10 in FIG. 6 for convenience of explanation, this does not mean that the chip areas 10s are formed to a visible degree at the stage of the process in FIG. 6.

As illustrated in FIG. 6A, resist patterns 71a covering the memory regions MEM included in the respective chip areas 10s and the regions between the memory regions MEM adjacent to each other in the Y direction are formed. The bonding layer Bi and the layers of the stacked structure LMas are then partly removed with use of the resist patterns 71a as masks.

As illustrated in FIG. 6B, the resist patterns 71a are slimmed in the X direction and in the Y direction, so that resist patterns 71b are formed. Specifically, in the X direction, both ends of each of the resist patterns 71a on the side of the row decoders RD are slimmed in the Y direction, only one end of each of the resist patterns 71a on the side of the sense amplifier SA is slimmed. The layers of the stacked structure LMas are then further partly removed with use of the resist patterns 71b as masks.

As illustrated in FIG. 6C, the resist patterns 71b are slimmed in the X direction and in the Y direction, so that resist patterns 71c are formed Both ends of each of the resist patterns 71b are slimmed in the X direction, and one end of each of the resist patterns 71b on the side of the sense amplifier SA is slimmed in the Y direction. The layers of the stacked structure LMas are then further partly removed with use of the resist patterns 71c as masks.

The slimming of the resist patterns and the removal of the insulating layers OL and NL corresponding to one step of the stepped portions STRx and STRy are repeated as described above, and a lower part of the stepped portion STRx and the stepped portion STRy are thus formed. Details thereof are illustrated in subsequent cross-sectional views.

Figure 7A:
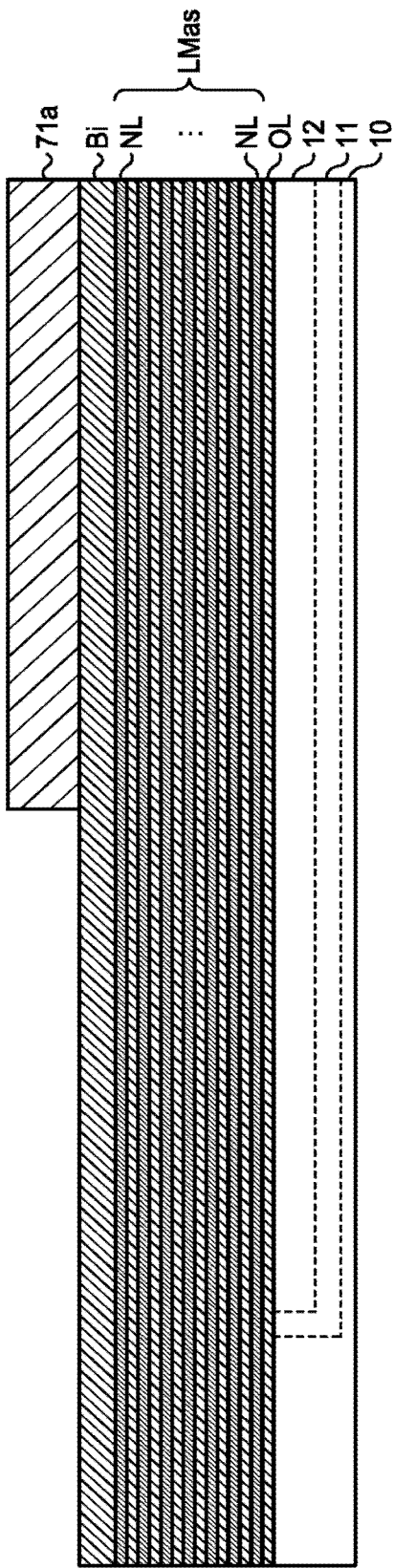
FIGS. 7A and 7B are flow diagrams illustrating an example of procedures of the process of manufacturing the semiconductor memory device according to the first embodiment.
Figure 7B:
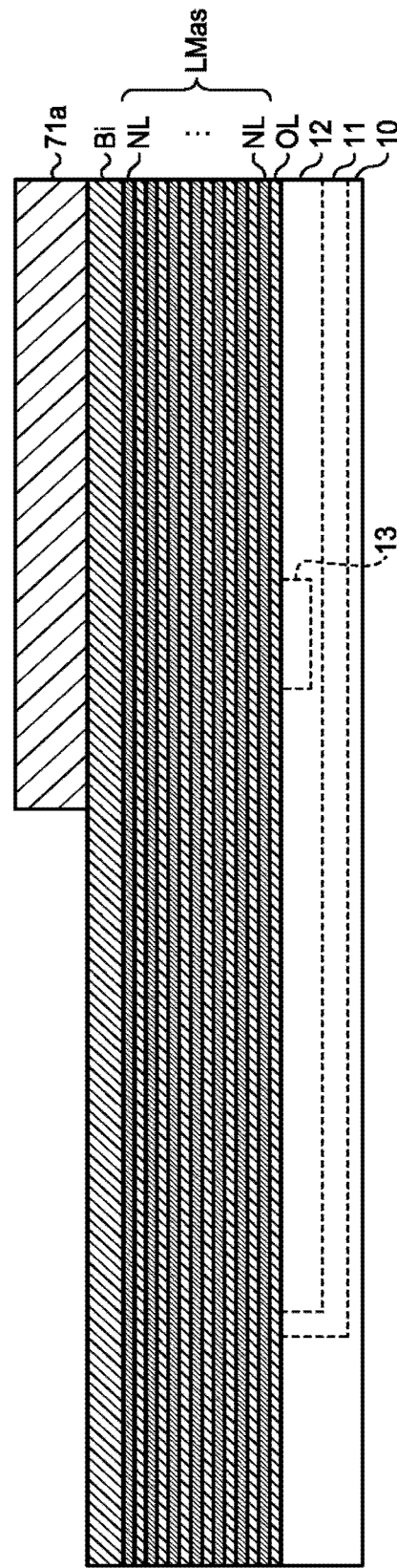

As illustrated in FIGS. 7A and 7B, resist patterns 71a are formed on the stacked structure LMas and the bonding layer Bi. In FIG. 7A, an end of a resist pattern 71a is positioned at a position substantially corresponding to a leading end of the stepped portion STRx in the X direction to be formed later. In FIG. 7B, an end of the resist pattern 71a is positioned at a position substantially corresponding to a leading end of the stepped portion STRy in the Y direction to be formed later.

As illustrated in FIGS. 8A and 8B, the bonding layer Bi and the uppermost insulating layer NE are removed with use of the resist pattern 71a as a mask. As a result, the stacked structure LMas has a stepped shape including one step.

As illustrated in FIGS. 9A and 9B, the resist pattern 71a is slimmed to form a resist pattern 71b. In FIG. 9A, the resist pattern 71a is set back by a distance substantially equal to the width in the X direction of a terrace portion of the stepped portion STRx in the X direction to be formed later. In FIG. 9B, the resist pattern 71a is set back by a distance substantially equal to the width in the Y direction of a terrace portion of the stepped portion STRy in the Y direction to be formed later.

As illustrated in FIGS. 10A and 10B, the portions of the bonding layer Bi and the uppermost insulating layer NE that are newly exposed by the slimming are removed with use of the resist pattern 71b as a mask. In addition, at the portions where the bonding layer Bi and the uppermost insulating layer NL are already removed, one insulating layer OL and one insulating layer NL under the uppermost insulating layer NL are removed. As a result, the stacked structure LMas has a stepped shape including two steps.

As illustrate in FIGS. 11A and 11B, the resist pattern 71b is slimmed to form a resist pattern 71c. In a manner similar to the above, the distance by which the resist pattern 71b is set back is about the same as the width of one terrace portion of the stepped portions STRx and STRy.

Figure 12A:
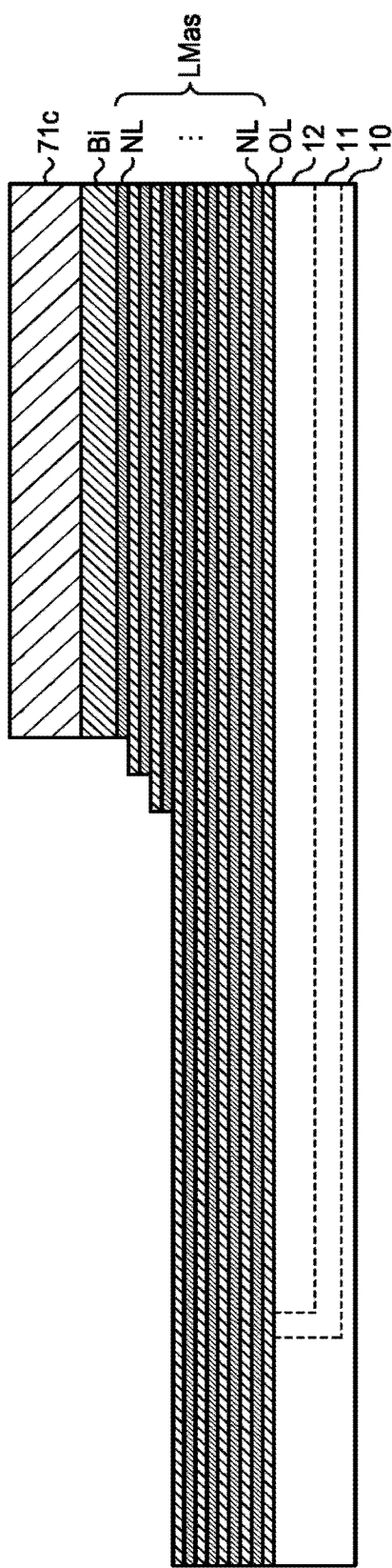
FIGS. 12A and 12B are flow diagrams illustrating an example of procedures of the process of manufacturing the semiconductor memory device according to the first embodiment.
Figure 12B:
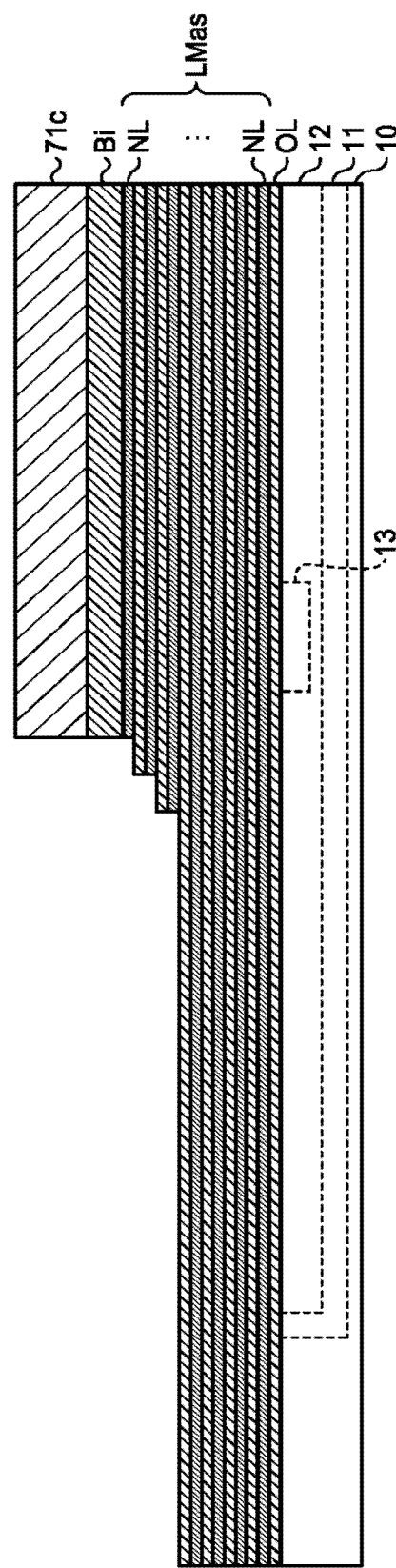

As illustrated in FIGS. 12A and 12B, the portions of the bonding layer Bi and the uppermost insulating layer NL that are newly exposed by the slimming are removed with use of the resist pattern 71c as a mask. In addition, at the portions where the bonding layer Bi and the uppermost insulating layer NL are already removed, one insulating layer OL and one insulating layer NL under the uppermost insulating layer NL are removed. At the portions where one insulating layer OL and one insulating layer NL under the uppermost insulating layer NL have been removed, one insulating layer OL and one insulating layer NL thereunder are further removed. As a result, the stacked structure LMas has a stepped shape including three steps.

As illustrated in FIGS. 13A and 13B, the slimming of the resist patterns and the removal of the insulating layers OL and NIL corresponding to one step of the stepped portions STRx and STRy are repeated, so that a stepped portion STRa, which is a lower part of the stepped portion STRx, and the stepped portion STRy are formed.

A gate electrode GE is formed in a peripheral area of the stepped portions STRa and STRy, and active areas AA are formed in a self-aligning manner, for example, on the wafer 10 on both sides of the gate electrode GE. As a result, a transistor TR is formed.

An insulating layer 52 covering the stepped portions STRa and STRy and the transistor TR is formed up to a height substantially equal to the top surface of the bonding layer Bi on the stacked structure LMas.

A contact CSs filled with a sacrificing layer that extends through the insulating layer 52 and reaches the gate electrode GE is formed, and a bonding portion Bs constituted by the sacrificing layer or the like is formed on the contact CSs. The sacrificing layer constituting the contact CSs and the bonding portion Bs is an amorphous silicon layer or the like that can be replaced with a conducting layer such as a tungsten layer in a later process.

A pillar PLs filled with the sacrificing layer is formed in a lower structure of the pillar PL in the stacked structure LMas on the inner side of the stepped portions STRa and STRy. Specifically, a memory hole extending through the bonding layer Bi and the stacked structure LMas is formed, and the inside of the memory hole is filled with the sacrificing layer that is an amorphous silicon layer. As a result, the pillar Pts having a bonding portion Bps at an upper end portion is formed.

Figure 14A:
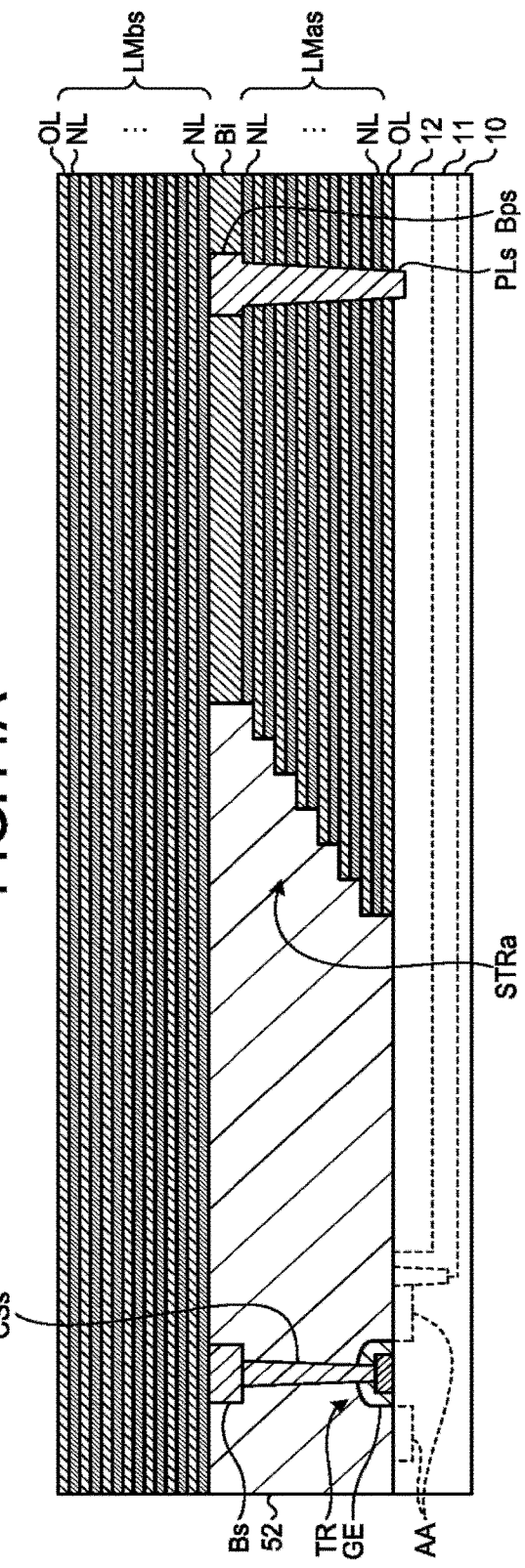
FIGS. 14A and 14B are flow diagrams illustrating an example of procedures of the process of manufacturing the semiconductor memory device according to the first embodiment.
Figure 14B:
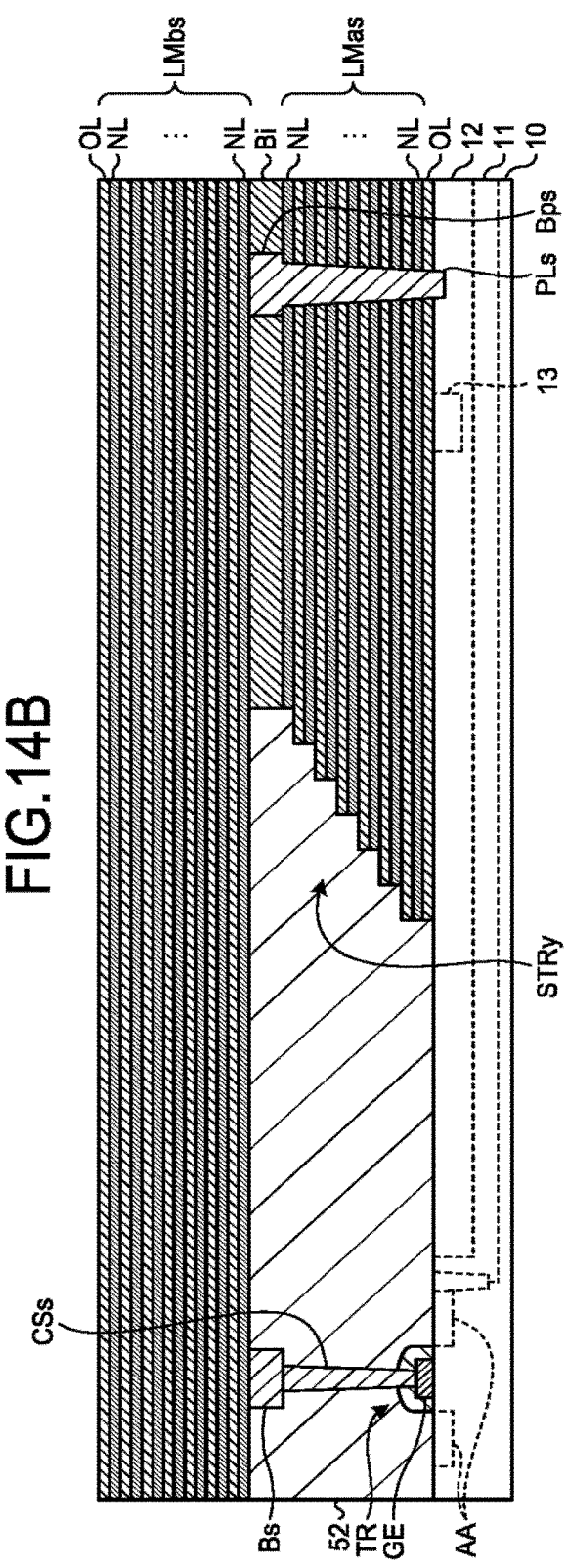

As illustrated in FIGS. 14A and 14B, a stacked structure LMbs covering the insulating layer 52 on the stepped portions STRa and STRy and on the transistor TR, and the stacked structure LMas is formed on the wafer 10.

Figure 15:
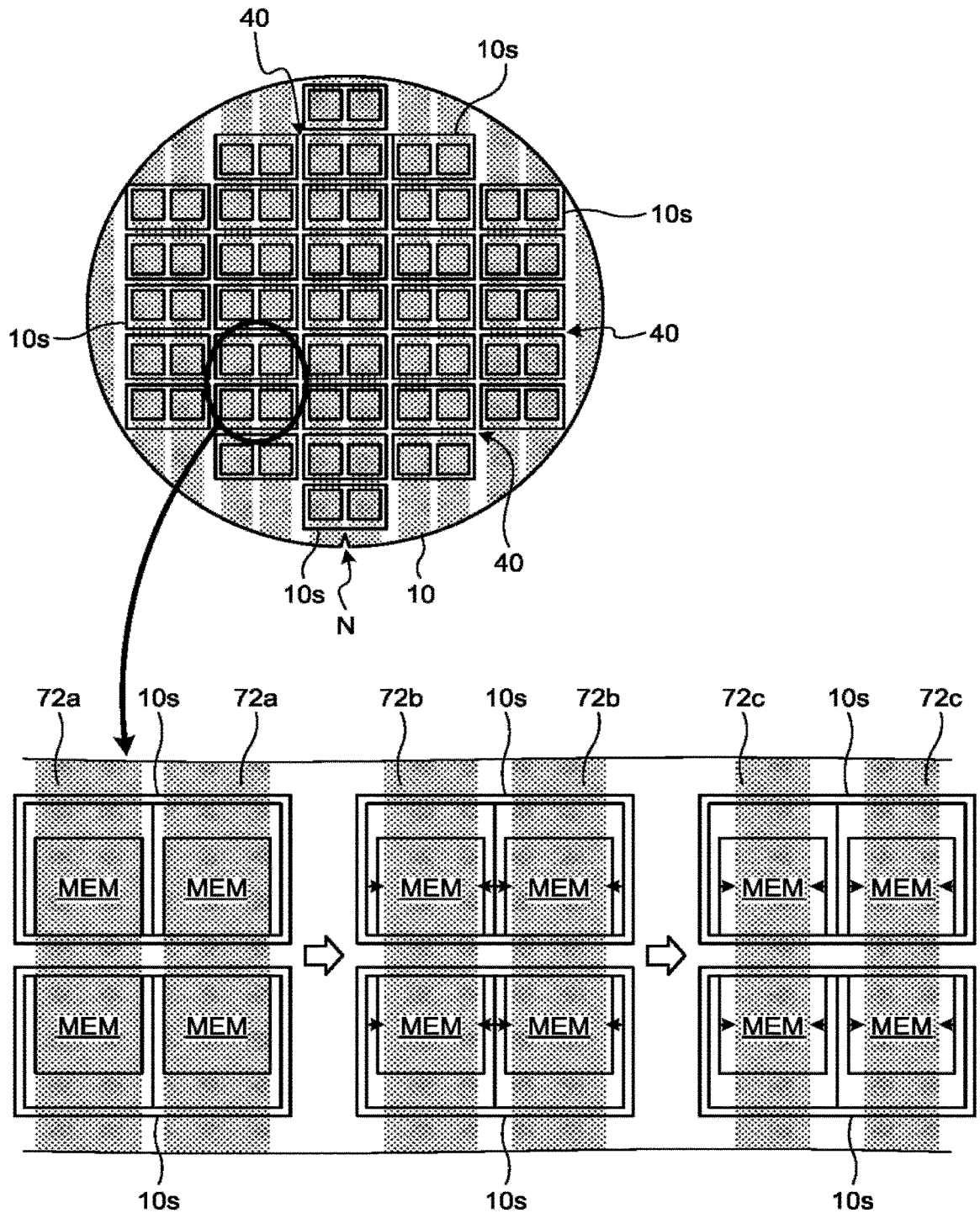

Thereafter, the stacked structure LMbs formed on the wafer 10 is partly covered with a resist pattern. This process is illustrated in FIG. 15. FIG. 15 is a diagram illustrating an example of arrangement of resist patterns 72a to 72c in the process of manufacturing the semiconductor memory device 1 according to the first embodiment.

As illustrated in FIG. 15, resist patterns 72a to 72c covering, in an elongated manner, memory regions MEM in a plurality of chip areas 10s arranged in the Y direction are formed FIGS. 15A to 15C illustrate enlarged views of two chip areas 10s in which memory regions MEM are arranged close to each other.

As illustrated in FIG. 15A, resist patterns 72a including the memory regions MEM included in the respective chip areas 10s and extending in the Y direction in an elongated manner are formed. The layers of the stacked structure LMbs in the X direction are then partly removed with use of the resist patterns 72a as masks. In this process, the stacked structure LMbs is not removed in the Y direction.

As illustrated in FIG. 15B, the resist patterns 72a are slimmed in the X direction to form resist patterns 72b. Specifically, in the X direction, both ends of each of the resist patterns 72a on the side of the row decoders RD are slimmed. In the Y direction, the resist patterns 72a are not slimmed. The layers of the stacked structure LMbs in the X direction are then further partly removed with use of the resist patterns 72b as masks. In this process, the stacked structure LMbs is not removed in the Y direction.

As illustrated in FIG. 15C, the resist patterns 72b are slimmed in the X direction to form resist patterns 72c. Both ends of each of the resist patterns 72b are slimmed only in the X direction. The layers of the stacked structure LMbs in the X direction are then further partly removed with use of the resist patterns 72c as masks. In this process, the stacked structure LMbs is not removed in the Y direction.

The slimming of the resist patterns and the removal of the insulating layers CL and NL in the X direction are repeated as described above, so that the stacked structure LMbs in the X direction is also processed in a stepped shape and the stepped portion STRx is thus formed.

As illustrated in the cross-sectional view in the X direction of FIG. 16A, the stacked structure LMbs is also processed in the stepped shape in the X direction, and a stepped portion STRx is formed at ends in the X direction of the stacked structure LMas and the stacked structure LMbs. The insulating layer 52 is further increased in thickness to have a top surface at a height substantially equal to the height of the top surface of the stacked structure LMbs.

As illustrated in the cross-sectional view in the Y direction of FIG. 16B, the stacked structure LMbs is not removed in the Y direction, and remains extending over a plurality of chip areas 10s including the memory regions MEM, the peripheral circuits PER, and the kerf region 30 including the scribe lines 40.

As illustrated in FIGS. 17A and 17B, a pillar Pt is formed through the stacked structures LMas and LMbs at a position on an inner side of the stepped portions STRx and STRy. Specifically, a memory hole extending through the stacked structure LMbs and reaching the bonding portion Bps is formed, and the sacrificing layer in the pillar PLs is removed via the memory hole. A memory layer ME such as $SiO_2$/SiN/$SiO_2$ layers, a channel layer CN such as an amorphous silicon layer or a polysilicon layer, and a core layer CR such as an $SiO_2$ layer are formed in this order from the inner wall of the memory hole extending through the stacked structures LMas and LMbs and being open. The channel layer CN is also formed at the bottom of the memory hole. As a result, a pillar PL having a bonding portion Bp at a position at a height about the center is formed.

As illustrated in FIGS. 18A and 18B, an insulating layer 53 covering the top surface of the stacked structure LMbs and the top surface of the insulating layer 52 is formed.

As illustrated in FIG. 18B, a slit ST is formed through the stacked structures LMas and LMbs at a position on an inner side of the stepped portion STRy. Specifically, a slit ST extending through the insulating layer 53 and the stacked structures LMas and LMbs, reaching the $n^+$ diffusion region 13, and extending in the X direction is formed. At this point, the slit ST is not filled with anything.

As illustrated in FIGS. 19A and 19B, the insulating layers NL in the stacked structures Mas and LMbs are removed via the slit ST.

As illustrated in the cross-sectional view in the X direction of FIG. 19A, all the insulating layers NL in the X direction of the stacked structures LMas and LMbs are removed, so that stacked structures LMag and LMbg in which gaps are provided between the insulating layers are formed.

As illustrated in the cross-sectional view in the Y direction of FIG. 19B, at least all the insulating layers NL in the stacked structures LMas and LMbs arranged in the memory regions MEM, and the stacked structures LMag and LMbg in which gaps are provided between the insulating layers OL are formed. More preferably, in the stacked structure LMbs, the insulating layers NL within a predetermined range on the side of the peripheral circuits PER along the Y direction from immediately above the stepped portion STRy are further removed.

The range in which the insulating layers NL are removed is, however, at least a range before reaching the peripheral circuits PER. Thus, at least the insulating layers NL in the stacked structure LMbg above the peripheral circuits PER remain unremoved.

In addition, the insulating layers NL also remain unremoved in the kerf region 30 and scribe lines 40 on the side on which the peripheral circuits PER are arranged. Furthermore, the insulating layers NL also remain unremoved in at least the scribe lines 40 on the side opposite to the side on which the peripheral circuits PER are arranged. More preferably, the insulating layers NI also remain unremoved in the kerf region 30 on the side opposite to the side on which the peripheral circuits PER are arranged.

The range in which the insulating layers NL are removed is within a predetermined range from the slit ST. The range in which the insulating layers NL are removed can be set as described above by adjustment of the position at which the slit ST is formed in the stacked structures LMas and LMbs.

As illustrated in FIGS. 20A and 20B, the gaps in the stacked structures LMag and LMbg resulting from the removal of the insulating layers NL are filled with a conducting material such as tungsten or molybdenum via the slit ST.

As illustrated in the cross-sectional view in the X direction of FIG. 20A, stacked structures LMa and LMb in which word lines WL are stacked between the insulating layers OL are formed.

As illustrated in the cross-sectional view in the Y direction of FIG. 20B, stacked structures LMa and LMb in which the word lines WL are stacked at least between the insulating layers OL arranged in the memory regions MEM, and in which the insulating layers NI are present between the insulating layers OL above the peripheral circuits PER, the kerf region 30 on the side of the peripheral circuits PER, and the scribe lines 40 on the side of the peripheral circuits PER are formed. In addition, in the stacked structures LMa and LMb, the insulating layers NL remain between the insulating layers OL above the scribe lines 40 on the side opposite to the tide on which the peripheral circuits PER are arranged, and more preferably above the kerf region 30.

In other words, in the stacked structure LMb, the first layers FL in which the conducting regions 61 (see FIGS. 2A and 2B) constituted by the word lines WL are arranged in the memory regions MEM, and in which the insulating regions 62 (see FIGS. 2A and 2B) constituted by the insulating layers NL are arranged in the regions of the peripheral circuits PER and the kerf region 30 on the side of the peripheral circuits PER are formed.

As described above, the insulating layers NL in the memory regions MEM are removed and replaced with the conducting layers, so that the word lines WL to be connected with memory cells MC arranged in the memory regions MEM are formed. In addition, the insulating layers NL in the regions of the peripheral circuits PER remain without being replaced with conducting layers, so that short-circuits of contacts CS to be formed through the stacked structure LMb above the transistors TR in a later process can be prevented.

Note that the process of forming the stacked structures LMa and LMb by replacing at least some of the insulating layers NL in the stacked structures LMas and LMbs with conducting layers (word lines WL) as illustrated in FIGS. 18A to 20E may be called a replacing process or the like.

As illustrated in the cross-sectional view in the Y direction of FIG. 21B, the slit ST is filled with the insulating layer 51 and the conducting layer 50, for example, in this order from the inner wall of the slit ST, so that a source line contact LI is formed. In a case where the slit ST is not to function as a source line contact LI, the slit ST may be filled with an insulating layer such as an $SiO_2$ layer or an SiN layer.

As illustrated in the cross-sectional view in the X direction of FIG. 22A, a contact CS extending through the insulating layers 53 and 52 and reaching the gate electrode GE is formed. Specifically, a contact hole extending through the insulating layers 53 and 52 and reaching the bonding portion Bs is formed above the transistor TR. The sacrificing layer in the bonding portion Bs and the contact CSs is removed via the contact hole, and the contact CSs, the bonding portion Bs, and the contact hole above the bonding portion Bs are filled with a conducting material, so that a contact CS having a bonding portion Bc is formed.

In addition, contacts CC extending through the insulating layers 53 and 52 and each reaching the word line WL on an associated one step of the stepped portion STRx are formed. Specifically, contact holes extending through the insulating layers 53 and 52 and each further extending through the insulating layers OL that are upper layers of the associated one of steps of the stepped portion STRx are formed. The contact holes are filled with a conducting material, so that the contacts CC each connected with the word line WL on the associated step of the stepped portion STRx are formed.

As illustrated in the cross-sectional view in the Y direction of FIG. 22B, a contact CS extending through the insulating layer 53, the insulating layers OL and NL in the stacked structure LMb, and the insulating layer 52 and reaching the gate electrode GE is formed. Specifically, a contact hole extending through the insulating layer 53 and the stacked structure LMb and reaching the bonding portion Bs is formed above the transistor TR. The sacrificing layer in the bonding portion Bs and the contact CSs is removed via the contact hole, and the contact CSs, the bonding portion Bs, and the contact hole above the bonding portion Bs are filled with a conducting material, so that a contact CS having a bonding portion Bc is formed.

As illustrated in FIGS. 23A and 23B, an insulating layer 54 covering the insulating layer 53 is formed. In the memory regions MEM, a plug CH extending through the insulating layers 54 and 53 and connected with the channel layer CN of the pillar PL is formed, and a bit line BE connected with the upper end of the plug CH is formed in the insulating layer 54. In the peripheral circuit PER, a plug V0 extending through. The insulating layer 54 and connected with the upper end of the contact CS is formed.

As illustrated in the cross-sectional view in the X direction of FIG. 23A, at the stepped portion STRx, plugs V0 extending through the insulating layer 54 and each connected with the upper end of the associated one of the contacts CC are formed.

As illustrated in the cross-sectional view in the Y direction of FIG. 23B, in the memory regions MEM, a plug V0 extending through the insulating layer 54 and connected with the conducting layer 50 of the source line contact LI is formed.

Figure 24A:
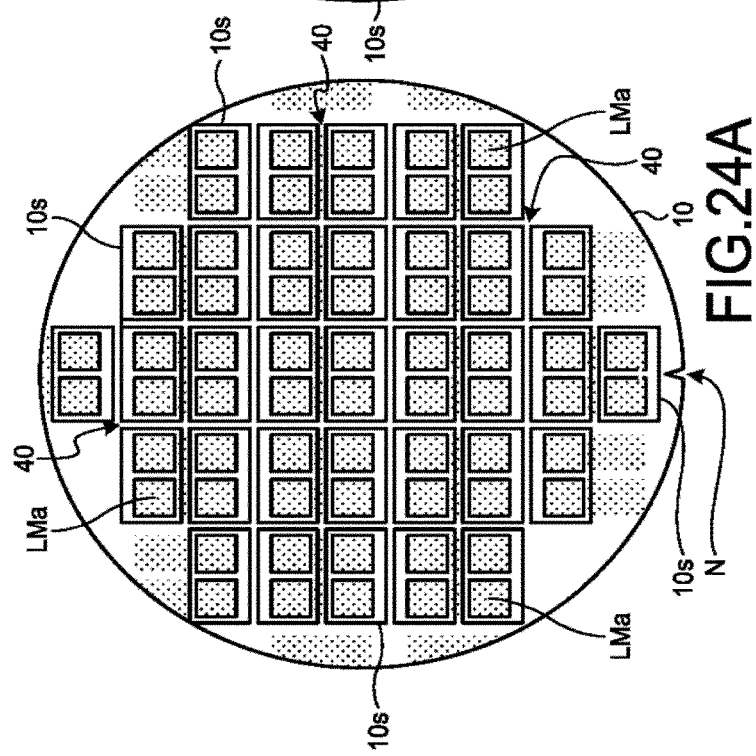
FIGS. 24A to 24C are diagrams schematically illustrating structures on a wafer in the process of manufacturing the semiconductor memory device according to the first embodiment.
Figure 24B:
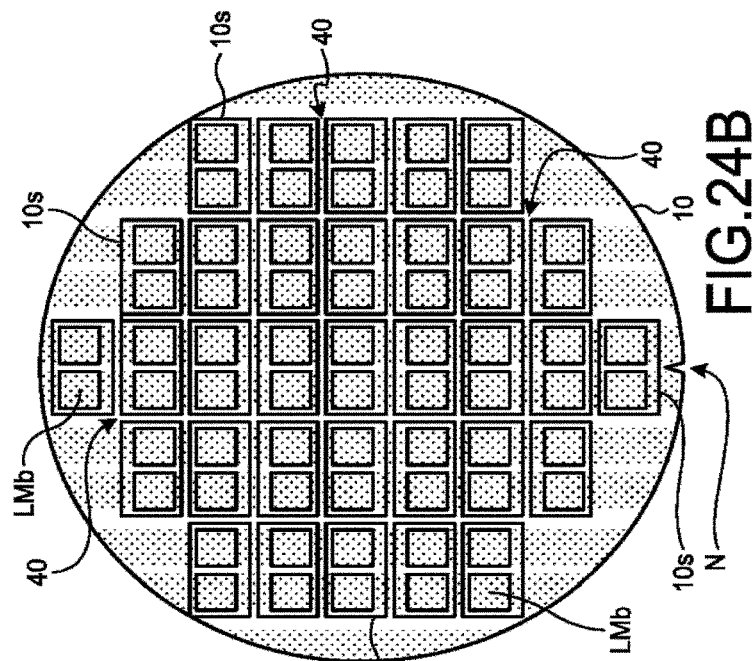
Figure 24C:
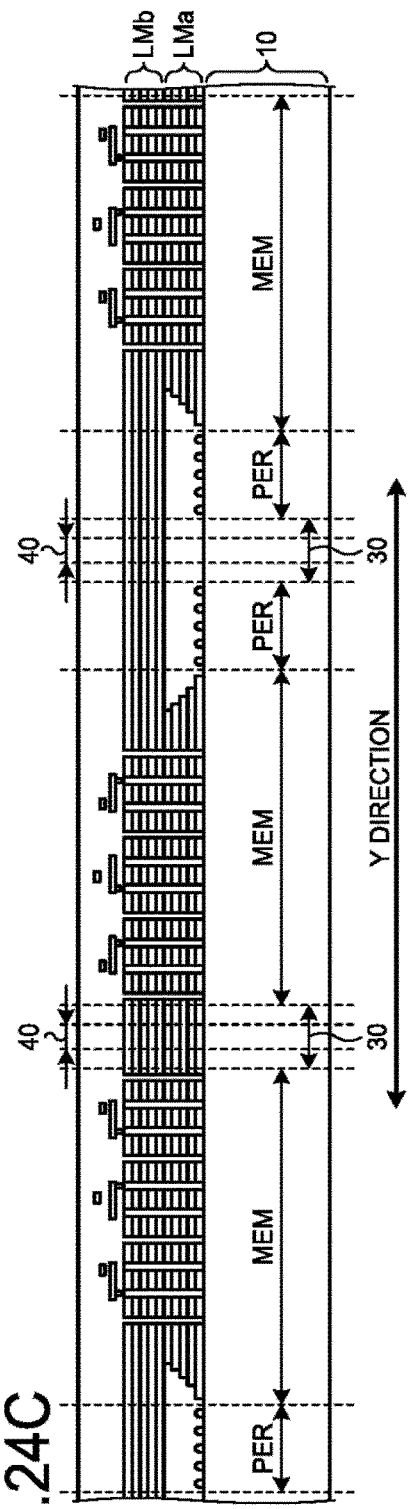

As described above, a structure in which at least part of the stacked structures LMa and LMb extends in the Y direction is formed on the wafer 10. This structures are illustrated in FIGS. 24A to 24C. FIGS. 24A to 24C are diagrams schematically illustrating structures on the wafer 10 in the process of manufacturing the semiconductor memory device 1 according to the first embodiment.

FIG. 24A is a plan view illustrating arrangement of the stacked structures LMa formed on the wafer 10. As illustrated in FIG. 24A, in the X direction, the stacked structures LMa are arranged in the respective memory regions MEM. On the side of the peripheral circuits PER in the Y direction, the stacked structures LMa are arranged in the respective memory regions MEM. On the side opposite to the peripheral circuits PER in the Y direction, the stacked structures LMa are each arranged over two memory regions MEM adjacent to each other.

FIG. 24B is a plan view illustrating arrangement of the stacked structures LMb formed on the wafer 10. As illustrated in FIG. 24B, in the X direction, the stacked structures LMb are arranged in the respective memory regions MEM. In the Y direction, the stacked structures LMb are each arranged over the memory regions MEM in the respective chip areas 10s arranged in the Y direction.

FIG. 24C is a cross-sectional view in the Y direction of the structures formed on the wafer 10. As illustrated in FIG. 24C, in the Y direction, a stacked structure LMa extends from an end, on the side of a peripheral circuit PER, of one memory region MEM through a kerf region 30 including scribe lines 40 on the side opposite to the peripheral circuit PER to an end, on the side of a peripheral circuit PER, of another adjacent memory region RPM. In the Y direction, a stacked structure LMb extends also over the peripheral circuits PER and a kerf region 30 including scribe lines 40 on the side on which the peripheral circuits PER are arranged.

The wafer 10 on which the structures as described above are formed is diced along the scribe lines 40, and semiconductor memory devices 1 on substrates 10c resulting from cutting are thus obtained. As described above, at least the first layers FL arranged on the scribe lines 40 are insulating layers ML without being replaced with word lines WL, and more preferably, the first layers FL arranged on the kerf region 30 are insulating layers NL without being replaced with word lines ML, which enables dicing to be performed while suppressing contamination and generation of particles. Thereafter, the semiconductor memory devices 1 obtained by cutting are packaged.

The process of manufacturing the semiconductor memory device 1 according to the first embodiment is terminated here.

A three-dimensional nonvolatile memory is formed by arranging memory cells three-dimensionally in a stacked structure in which a plurality of wiring layers are stacked via insulating layers, for example. A stacked structure formed on a wafer is divided in four directions, so that individual memory regions are electrically separated and each function as one plane.

The memory regions having the stacked structure and the peripheries of the memory regions in which insulating layers are arranged substantially in blocks are, however, greatly different in materials from each other. Thus, the stacked structures of the memory regions may be distorted by stress such as expansion and contraction, and the pillars may be misaligned while being formed in a matrix in the memory regions.

According to the wafer 10 of the first embodiment, at least some of the layers FL and OL in the stacked structures LMas and LMbs extend over chip areas 10s adjacent to each other in the Y direction. As a result, the difference in materials between the memory regions MEM and the peripheral regions thereof is reduced, and stress is thus reduced. Furthermore, the stacked structures LMas and LMbs are fixed in the Y direction, which makes distortion due to expansion, contraction or the like less likely to occur. Misalignment of the pillars PL in the memory regions MEM is therefore suppressed, for example.

According to the wafer 10 of the first embodiment, the positions of slits ST extending through the stacked structures LMas and LMbs in the X direction are adjusted. This enables the conducting regions 61 to be arranged in the memory regions MEM and function as word lines WL, and enables the insulating regions 62 to be arranged in the regions of the peripheral circuits PER to prevent short-circuits with the contacts CS connected with the transistors TR, for example. In addition, the insulating regions 62 are arranged at least on the scribe lines 40 and more preferably in the kerf region 30, which suppresses contamination and particles during dicing.

First Modification

Next, a semiconductor memory device 1a according to a first modification of the first embodiment will be described with reference to FIGS. 25 and 26. The semiconductor memory device 1a according to the first modification is different from the first embodiment described above in that part of a stacked structure LMaa, which is a lower structure, instead of a stacked structure LMba, which is an upper structure, extends to the side of the peripheral circuit PER. The other components will be represented by the same reference symbols as those in the first embodiment described above, and description thereof will not be repeated.

Figure 25:
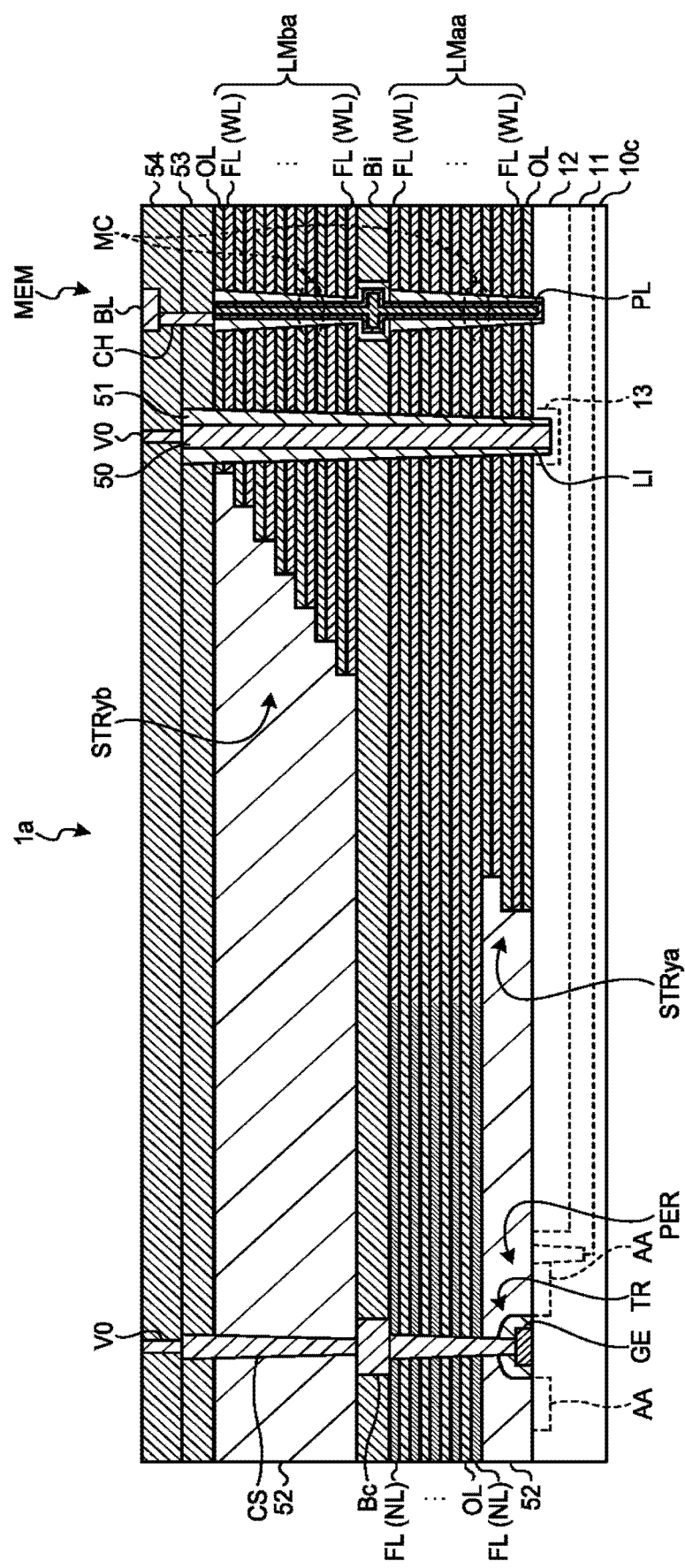
FIG. 25 is a cross-sectional view illustrating an example of configurations of stepped portions and a peripheral circuit of a semiconductor memory device according to a first modification of the first embodiment.

FIG. 25 is a cross-sectional view illustrating an example of the configurations of stepped portions STRya and STRyb and a peripheral circuit PER of the semiconductor memory device 1a according to the first modification of the first embodiment. As illustrated in the cross-sectional view in the Y direction of FIG. 25, the semiconductor memory device is includes the stacked structure LMaa on the substrate 10c, and the stacked structure LMba above the stacked structure LMaa with a bonding layer Bi therebetween. The stacked structures LMaa and LMba also have a structure in which a plurality of first layers FL and a plurality of insulating layer OL as second layers are stacked.

The stacked structure LMaa includes a stepped portion STRya as dummy steps. The number of steps and the height of the stepped portion STRya are adjusted so as to allow minimum space for a peripheral circuit PER. The stepped portion STRya is covered with the insulating layer 52. In the stacked structure LMaa, the first layers FL, the insulating layers CL, and the bonding layer Bi above the stepped portion STRya extend to above the peripheral circuit PER and reach the end of the substrate 10c on the side of the peripheral circuit PER.

The first layers FL in the stacked structure LMaa form the conducting region constituted by conducting layers such as tungsten layers or molybdenum layers in the memory region MEN including the stepped portion STRya. The first layers FL in the stacked structure LMaa form the insulating region constituted by insulating layers NL such as SiN layers in an area from a predetermined position outside of the memory region MEM toward the peripheral circuit PER, over the peripheral circuit PER, to an end of the substrate 10c.

The stacked structure LMba includes a stepped portion STRyb as dummy steps. All the first layers FL and insulating layers CL included in the stacked structure LMba constitute the stepped portion STRyb, and the stacked structure LMba does not extend over the peripheral circuit PER but is within the memory region MEM on the side on which the peripheral circuit PER is provided. The stepped portion STRyb is covered with the insulating layer 52 up to a position at substantially the same height as the stacked structure LMba, for example. The insulating layer 53 is provided on the insulating layer 52, and the insulating layer 54 is provided on the insulating layer 53. The contact CS of the peripheral circuit PER extends through the insulating layers 53 and 52, the bonding layer Bi, and the stacked structure LMaa, and is connected with the gate electrode GE of the transistor TR.

Procedures of a process of manufacturing the semiconductor memory device 1a of the first modification are different from those in the first embodiment. An example of the process of manufacturing the semiconductor memory device 1a of the first modification will be explained with reference to FIG. 26. FIG. 26 is a flowchart illustrating an example of the procedures of the process of manufacturing the semiconductor memory device 1a according to the first modification of the first embodiment. Note that, in the explanation below, the stacked structures LMaa and LMba be referred to as stacked structures LMaa and LMba both before and after replacement without being distinguished from each other.

Figure 26:
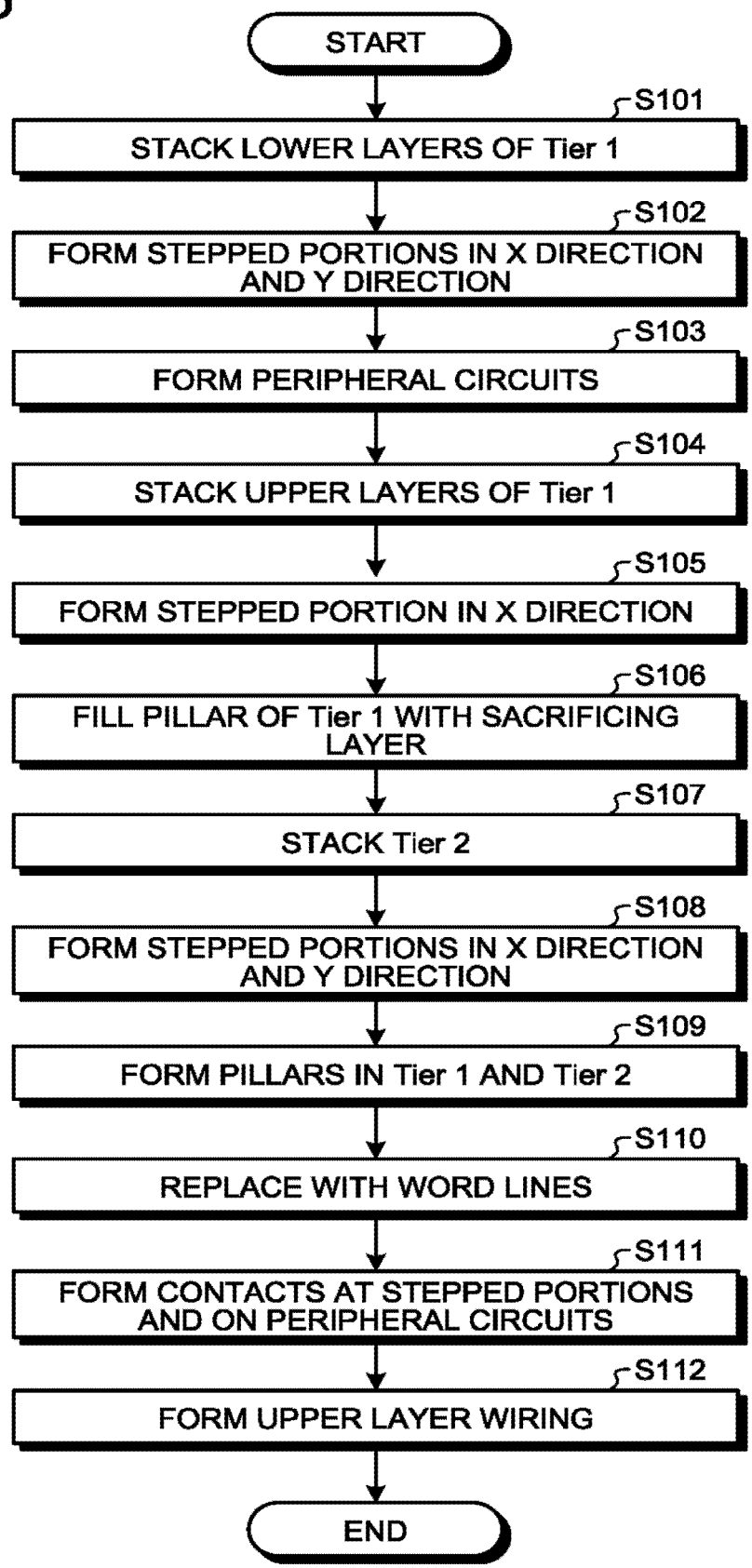
FIG. 26 is a flowchart illustrating an example of procedures of a process of manufacturing the semiconductor memory device according to the first modification of the first embodiment.

As illustrated in FIG. 26, only lower layers that constitute the stepped portion STRya, in particular, of the stacked structure LMaa, which is a first tier (Tier 1) of the stacked structures LMaa and LMba formed in two tiers (step S101).

Lower layer portions of the stepped portion STRx to be formed on the stacked structure LMaa are formed on both sides in the X direction of the stacked structure LMaa, and the stepped portion STRya is formed on one side in the Y direction (step S102).

Peripheral circuits PER are formed on both sides in the X direction and one side in the Y direction of the stacked structure LMaa (step S103).

Upper layers of the stacked structure LMaa, which is the first tier (Tier 1), are stacked (step S104).

Upper layer portions of the stepped portion STRx to be formed on the stacked structure LMaa are formed on both sides in the X direction of the stacked structure LMaa (step S105).

A pillar filled with a sacrificing layer is formed in a lower structure of the pillar Pt in the stacked structure LMaa of the first tier (Tier 1) (step S106).

The stacked structure LMba, which is the second tier (Tier 2) is stacked (step S107).

The stepped portion STRx is further formed on both sides in the X direction of the stacked structure LMba, and the stepped portion STRyb is formed on one side in the Y direction thereof (step S108).

Pillars Pt are formed in the stacked structures LMaa and LMba (step S109).

At least some insulating layers NL in the stacked structures LMaa and LMba are replaced with conducting layers (word lines WL) (step S110).

Contacts CC are formed at the stepped portions STRx, and contacts CS are formed on the peripheral circuits PER (step S111).

Plugs V0 are formed on the contacts CC at the stepped portions STRx and on the contacts CS on the peripheral circuits PER, and further connected with upper layer wiring. Plugs CH are formed on the pillars PL of the memory regions MEM, and further connected with bit lines BL (step S112).

The process of manufacturing the semiconductor memory device 1a according to the first modification is terminated here.

The semiconductor memory device 1a of the first modification produces effects similar to those of the semiconductor memory device 1 of the first embodiment.

Second Modification

Next, a semiconductor memory device 1b according to a second modification of the first embodiment will be described with reference to FIGS. 27 and 28. The semiconductor memory device 1b according to the second modification is different from the first embodiment described above in that part of the stacked structure LMaa, which is a lower structure, in addition to the stacked structure LMb, which is an upper structure, extends to the side of the peripheral circuit PER.

Figure 27:
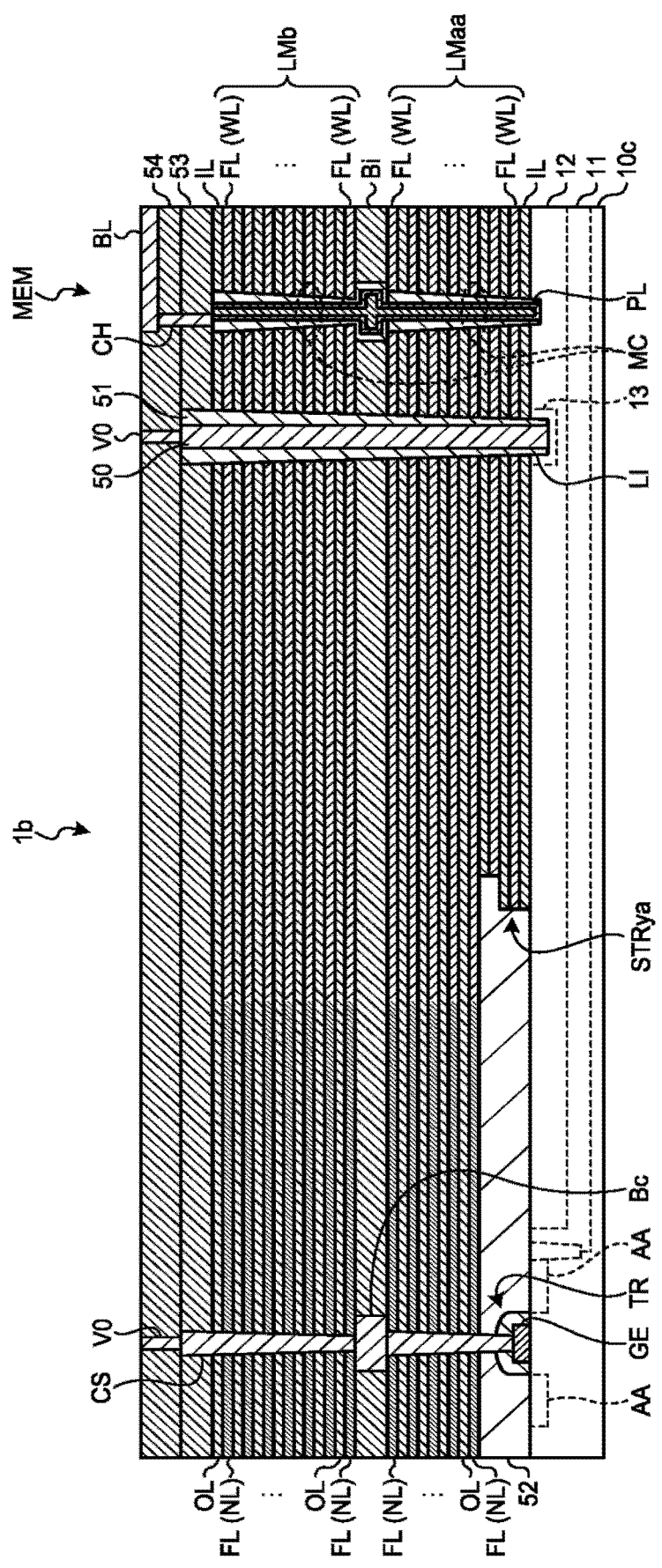
FIG. 27 is a cross-sectional view illustrating an example of configurations of stepped portions and a peripheral circuit of a semiconductor memory device according to a second modification of the first embodiment.

FIG. 27 is a cross-sectional view illustrating an example of the configurations of a stepped portion STRya and a peripheral circuit PER of the semiconductor memory device 1b according to the second modification of the first embodiment. As illustrated in the cross-sectional view in the Y direction of FIG. 27, the semiconductor memory device 1b includes the stacked structure LMaa on the substrate 10c, and the stacked structure LMb above the stacked structure LMaa with a bonding layer Bi therebetween. In other words, the semiconductor memory device 1b has a shape combining the stacked structure LMaa of the semiconductor memory device 1a according to the first modification and the stacked structure LMb of the semiconductor memory device 1 according to the first embodiment.

Figure 28:
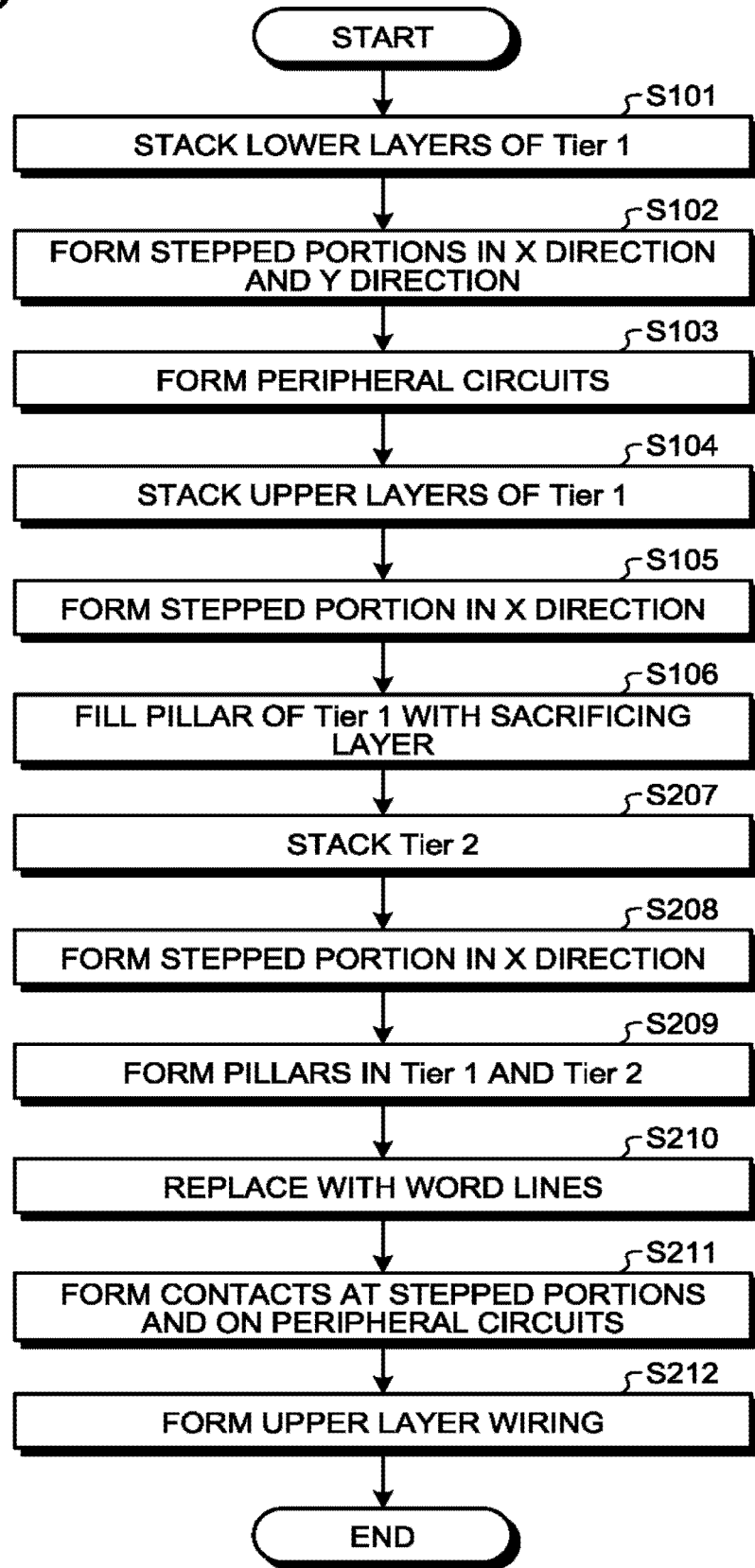
FIG. 28 is a flowchart illustrating an example of procedures of a process of manufacturing the semiconductor memory device according to the second modification of the first embodiment.

FIG. 28 is a flowchart illustrating an example or the procedures of a process of manufacturing the semiconductor memory device 1b according to the second modification of the first embodiment. As illustrated in FIG. 28, the semiconductor memory device 1b is manufactured by processing the stacked structure LMaa in the same manner as steps S101 to S106 of the process of manufacturing the semiconductor memory device 1a of the first modification, processing the stacked structure 114b in the same manner as the processes in FIGS. 14A to 17B (steps S207 to S209) in the process of manufacturing the semiconductor memory device 1 of the first embodiment, performing replacement with word lines WL (step S210), forming contacts CC, CS and the like (step S211), and forming upper layer wiring (step S212). In other words, the process of manufacturing the semiconductor memory device 1b is different from the process of manufacturing the semiconductor memory device 1a of the first modification described above only in that no stepped portion STRyb in the Y direction is formed in step S208.

The semiconductor memory device 1b of the second modification also produces effects similar to those of the semiconductor memory device 1 of the first embodiment.

Second Embodiment

A semiconductor memory device 2 according to a second embodiment will be explained with reference to FIGS. 29, 30A and 30B. The semiconductor memory device 2 of the second embodiment is different from the first embodiment described above in the number of planes included in the semiconductor memory device 2.

Figure 29:
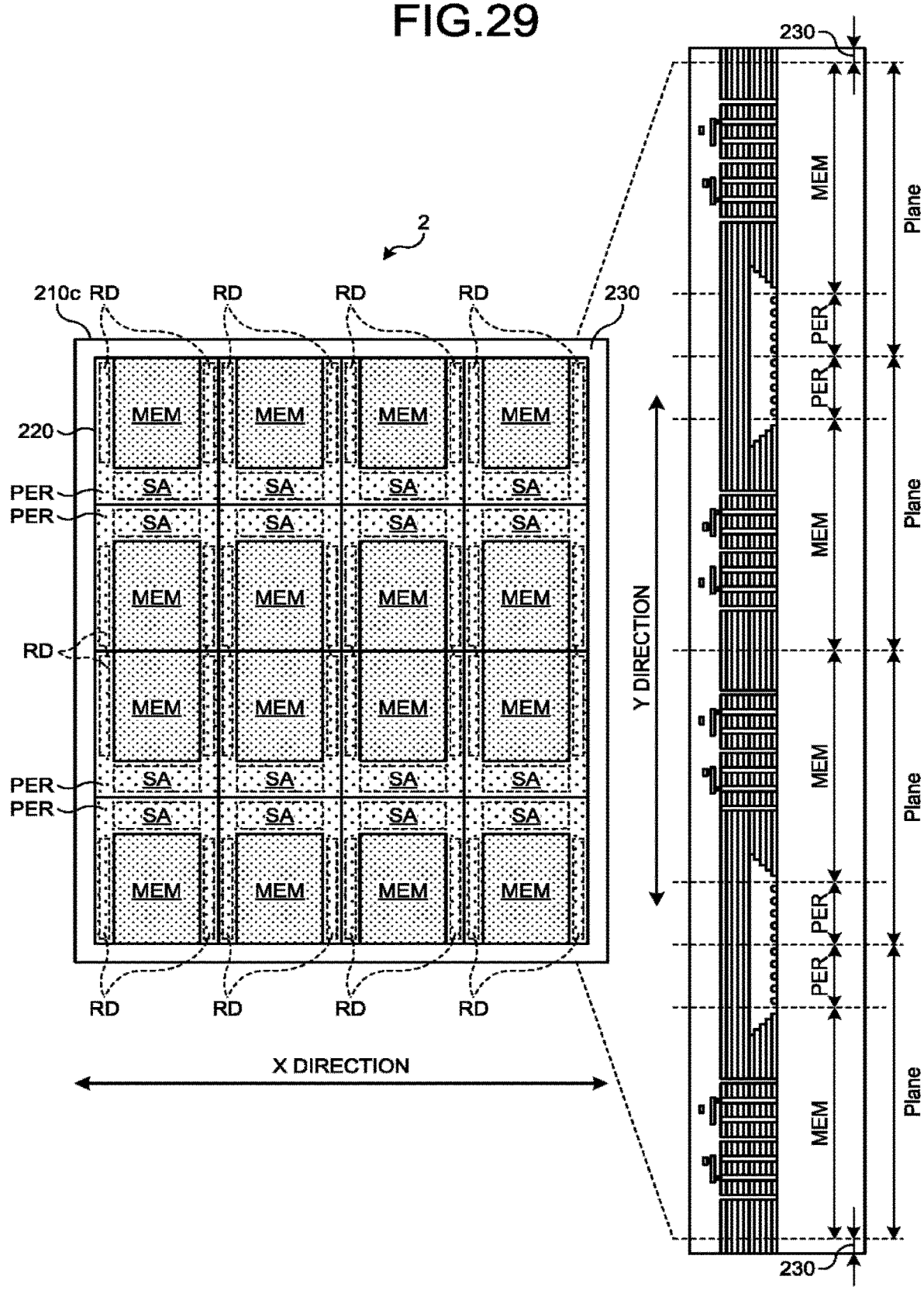
FIG. 29 is a diagram illustrating an example of a configuration of a semiconductor memory device according to a second embodiment.

FIG. 29 is a diagram illustrating an example of the configuration of the semiconductor memory device 2 according to the second embodiment. As illustrated in the plan view on the left of FIG. 29, the semiconductor memory device 2 includes 4×4 planes in (X direction)×(y direction), that is, a total of 16 planes within one substrate 210c. Thus, an element region 220 located at the central part of the substrate 210c includes 16 sets of memory regions MEM and peripheral circuits PER.

In planes located on the outermost column of the substrate 210c in the Y direction, the memory regions MEM are arranged on the outer side of the substrate 210c (close to a kerf region 230), and the peripheral circuits PER such as sense amplifiers SA are arranged on the inner side of the substrate 210c.

In planes located on two columns on the inner side of the substrate 210c in the Y direction, the memory regions MEM are arranged on the inner side of the substrate 210c and the planes in adjacent to each other in the Y direction are close to each other. The peripheral circuits PER such as sense amplifiers SA are arranged on the outer side of the substrate 210c. In addition, peripheral circuits PER such as row decoders RD are arranged on both sides in the X direction of each of the memory regions MEM.

As illustrated in the cross-sectional view in the Y direction on the right of FIG. 29, in a plane on the outermost column and a plane adjacent thereto on the inner side thereof, the memory regions MEM are arranged with two peripheral circuits PER therebetween. In contrast, in two adjacent planes on the inner side, two memory regions MEM are in contact with each other with no peripheral circuits PER and the like therebetween. These memory regions MEM belonging to different planes are each associated with peripheral circuits PER and operate independently of each other. Thus, these memory regions MEM are electrically separated from each other.

Figure 30A:
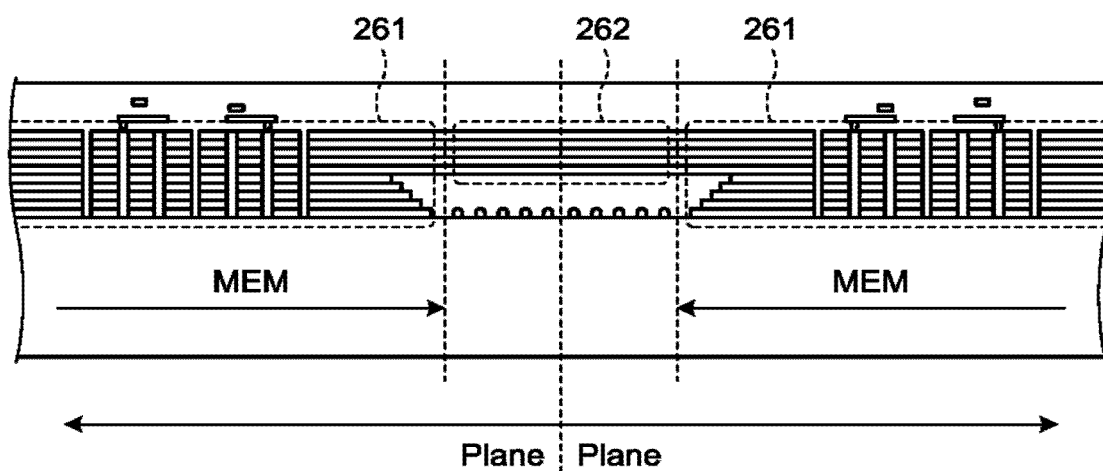
FIGS. 30A and 30B are cross-sectional views illustrating the way of electrical separation of memory regions of the semiconductor memory device according to the second embodiment.
Figure 30B:
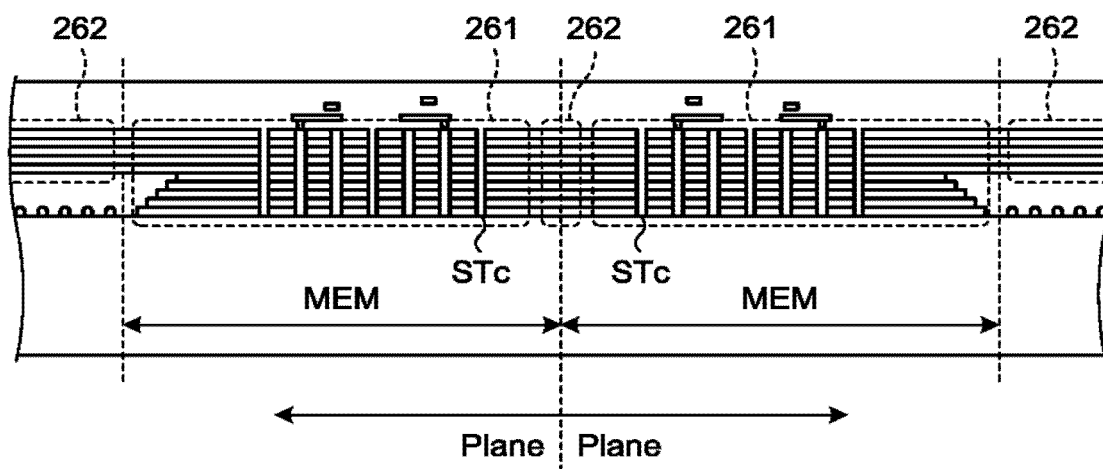

The way in which these memory regions MEM are electrically separated from each other is illustrated in FIGS. 30A and 30B. FIGS. 30A and 30B are cross-sectional views illustrating the way of electrical separation of the memory regions MEM of the semiconductor memory device 2 according to the second embodiment.

As illustrated in FIG. 30A, electrical separation between the memory regions MEM in the plane on the outermost column and the plane adjacent thereto on the inner side thereof is achieved by suppressing replacement of the insulating layers of the first layers arranged above the peripheral circuits PER with conducting layers, in a manner similar to the first embodiment, etc. described above. Thus, the arrangement can be such that a conducting region 261 of the first layers is arranged in each of the two memory regions MEM, and an insulating region 262 of the first layers is arranged in the region of the peripheral circuits PER between the two memory regions MEM.

As illustrated in FIG. 30B, electrical separation between the memory regions MEM in two adjacent planes on the inner side is also achieved by suppressing replacement of the insulating layers of the first layers arranged at the boundary of the memory regions MEM with conducting layers. More specifically, in each of the memory regions MEM, the position of the innermost slit STc on the substrate 210c, that is, a slit STc that is closest to the other memory region MEM is adjusted, so that the slits STc are arranged away from each other by a predetermined distance at which not all the insulating layers at the boundary between the memory regions MEM are removed but some of the insulating layers remain in the process of replacement with word lines WL. As a result, the arrangement can be such that a conducting region 261 of the first layers is arranged in each of the two memory regions MEM, and an insulating region 262 of the first layers is arranged at the boundary between the two memory regions MEM.

The semiconductor memory device 2 of the second embodiment also produces effects similar to those of the semiconductor memory device 1 of the first embodiment.

OTHER EMBODIMENTS

While the semiconductor memory device 1 includes the stacked structures LMa and LMb having a structure of two tiers in the first embodiment, etc. described above, the semiconductor memory device is not limited thereto. A semiconductor memory device may have a stacked structure of only one tier, or a stacked structure of three or more tiers.

The number of planes included in a semiconductor memory device is not limited to that in the first and second embodiments, etc. described above, and may be any number.

The arrangement of the peripheral circuits is not limited to that in the first and second embodiments, etc. described above, and may be arranged below the memory regions, that is, between the memory regions and the substrate.

A semiconductor memory device may include an edge seal (crack stopper) on the kerf region, for example, in addition to the structures of the first and second embodiments, etc. described above. The edge seal has a structure of a groove that extends through the stacked structures and in which an insulating layer or the like is embedded. The edge seal prevents a crack, if any, occurring on an edge of a substrate in the direction along the layers of a stacked structure during dicing or the like from extending deeper to an element region.

While certain embodiments have been described, these embodiments have been presented by way of example only, and are not intended to the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a lower layer structure including a peripheral circuit provided on a substrate, the substrate including a first region and a second region arranged in a first direction, the first region including first and second sub-regions and an intermediate region arranged between the first and second sub-regions in the first direction;
   a stacked structure which is provided above the lower layer structure and in which a plurality of first insulating layers and a plurality of conducting layers are alternately stacked in a second direction perpendicular to the first direction within the first and second sub-regions, and the plurality of first insulating layers and a plurality of second insulating layers different in material from the first insulating layers are alternately stacked in the second direction within the intermediate region and the second region; and
   a first pillar which includes a first memory layer and a first channel layer adjacently arranged sequentially from an outer surface of the first pillar, extends in the second direction through the stacked structure within one of the first and second sub-regions, and has an end reaching a layer of a semiconductor doped with impurities, and in which a bottom surface of the first channel layer is connected with the layer of the semiconductor, and first memory cells are formed at intersections with at least some of the plurality of conducting layers within the one of the first and second sub-regions, wherein
   the plurality of first insulating layers in the stacked structure is provided across the first region and the second region in the first direction so as not to be isolated within the intermediate region,
   the plurality of conducting layers and the plurality of second insulating layers in the stacked structure are coupled with each other in the first direction, and
   the plurality of second insulating layers within the second region is provided in the first direction from a coupling portion with the plurality of conducting layers within the one of the first and second sub-regions to a device end surface corresponding to a cut position of the substrate that forms a chip.

2. The semiconductor memory device according to claim 1, further comprising:

a second pillar which includes a second memory layer and a second channel layer adjacently arranged sequentially from an outer surface of the second pillar, extends in the second direction through the stacked structure within the other of the first and second sub-regions, and has an end reaching the layer of the semiconductor, and in which a bottom surface of the second channel layer is connected with the layer of the semiconductor, and second memory cells are formed at intersections with at least some of the plurality of conducting layers within the other of the first and second sub-regions.

3. The semiconductor memory device according to claim 1, wherein the stacked structure includes, at an end in a third direction perpendicular to the first direction and the second direction, a stepped portion in which an end of the plurality of conducting layers in the third direction forms a stepped shape.

4. The semiconductor memory device according to claim 1, wherein the plurality of conducting layers includes tungsten or molybdenum respectively, and the plurality of second insulating layers includes silicon nitride respectively.

5. The semiconductor memory device according to claim 4, wherein the plurality of first insulating layers includes silicon oxide respectively.

6. The semiconductor memory device according to claim 1, wherein the stacked structure includes a slit portion provided in the one of the first and second sub-regions, the slit portion extending in the second direction through the stacked structure and dividing the plurality of conducting layers in the stacked structure into a plurality of parts in the first direction.

7. The semiconductor memory device according to claim 1, wherein the first and second sub-regions correspond to first and second memory regions respectively disposed in first and second planes and are independently operable from each other.

8. The semiconductor memory device according to claim 1, wherein the stacked structure includes an edge seal structure extending through the stacked structure within the second region.

9. A semiconductor memory device comprising:
a lower layer structure including a peripheral circuit provided on a first substrate region of a substrate, the first substrate region corresponding to a chip area and including first, second and third sub-regions arranged in a first direction, a first intermediate region arranged between the first and second sub-regions in the first direction and a second intermediate region arranged between the second and third sub-regions in the first direction;
a stacked structure which is provided above the lower layer structure and in which a plurality of first insulating layers and a plurality of conducting layers are alternately stacked in a second direction perpendicular to the first direction within the first, second and third sub-regions, and the plurality of first insulating layers and a plurality of second insulating layers different in material from the first insulating layers are alternately stacked in the second direction within the first and second intermediate regions;
a first pillar which includes a first memory layer and a first channel layer adjacently arranged sequentially from an outer surface of the first pillar, extends in the second direction through the stacked structure within the first sub-region, and has an end reaching a layer of a semiconductor doped with impurities, and in which a bottom surface of the first channel layer is connected with the layer of the semiconductor, and first memory cells are formed at intersections with at least some of the plurality of conducting layers within the first sub-region;
a second pillar which includes a second memory layer and a second channel layer adjacently arranged sequentially from an outer surface of the second pillar, extends in the second direction through the stacked structure within the second sub-region, and has an end reaching the layer of the semiconductor, and in which a bottom surface of the second channel layer is connected with the layer of the semiconductor, and second memory cells are formed at intersections with at least some of the plurality of conducting layers within the second sub-region; and
a third pillar which includes a third memory layer and a third channel layer adjacently arranged sequentially from an outer surface of the third pillar, extends in the second direction through the stacked structure within the third sub-region, and has an end reaching the layer of the semiconductor, and in which a bottom surface of the third channel layer is connected with the layer of the semiconductor, and third memory cells are formed at intersections with at least some of the plurality of conducting layers within the third sub-region, wherein
the plurality of first insulating layers in the stacked structure is provided across the first, second and third sub-regions and the first and second intermediate regions in the first direction,
the plurality of conducting layers and the plurality of second insulating layers in the stacked structure are coupled with each other in the first direction, and
the stacked structure includes a first slit portion provided in the first sub-region, a second slit portion provided in the second sub-region, and a third slit portion provided in the third sub-region, the first to third slit portions extending in the second direction through the stacked structure and dividing the plurality of conducting layers in the stacked structure within the first to third sub-regions into a plurality of parts in the first direction respectively.

10. The semiconductor memory device according to claim 9, wherein a length of the second intermediate region in the first direction is shorter than a length of the first intermediate region in the first direction.

11. The semiconductor memory device according to claim 10, wherein the stacked structure includes, at an end in a third direction perpendicular to the first direction and the second direction, a stepped portion in which an end of the plurality of conducting layers in the third direction forms a stepped shape.

12. The semiconductor memory device according to claim 10, wherein the plurality of conducting layers includes tungsten or molybdenum respectively, and the plurality of second insulating layers includes silicon nitride respectively.

13. The semiconductor memory device according to claim 12, wherein the plurality of first insulating layers includes silicon oxide respectively.

14. The semiconductor memory device according to claim 10, wherein the first and second sub-regions correspond to first and second memory regions respectively disposed in first and second planes and are independently operable from each other.

* * * * *